United States Patent
Harayama

(10) Patent No.: US 12,529,955 B2
(45) Date of Patent: Jan. 20, 2026

(54) IMPRINT APPARATUS AND ARTICLE MANUFACTURING METHOD

(71) Applicant: CANON KABUSHIKI KAISHA, Tokyo (JP)

(72) Inventor: Tomohiro Harayama, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 67 days.

(21) Appl. No.: 18/351,637

(22) Filed: Jul. 13, 2023

(65) Prior Publication Data

US 2024/0045325 A1  Feb. 8, 2024

(30) Foreign Application Priority Data

Jul. 27, 2022 (JP) .................. 2022-119833

(51) Int. Cl.
*G03F 7/00* (2006.01)
*B29C 43/20* (2006.01)
*B29C 43/58* (2006.01)

(52) U.S. Cl.
CPC .......... *G03F 7/0002* (2013.01); *B29C 43/203* (2013.01); *B29C 43/58* (2013.01); *B29C 2043/5891* (2013.01)

(58) Field of Classification Search
CPC .................................................. G03F 7/0002
See application file for complete search history.

(56) References Cited

U.S. PATENT DOCUMENTS 9,426,429 B2  8/2016  Zheng et al.
2019/0369486 A1*  12/2019  Traub .................. B29C 59/022
2021/0097675 A1*  4/2021  Koga .................. G01N 21/8806

FOREIGN PATENT DOCUMENTS

JP  2013542468 A  11/2013
JP  6896036 B2  6/2021
KR  1020190092605 A  8/2019
WO  2012058233 A2  5/2012

* cited by examiner

*Primary Examiner* — Philip C Tucker
(74) *Attorney, Agent, or Firm* — ROSSI, KIMMS & McDOWELL LLP

(57) ABSTRACT

An imprint apparatus for performing an imprint process of forming a pattern of an imprint material on a substrate using a mold, including a control unit configured to control a process concerning inspection of the imprint process, wherein the imprint process includes an arrangement process including stage driving of driving a stage between a first position below the mold and a second position below a dispenser, and in a case where a plurality of states are obtained, in each of which a shot region is sub-pixel shifted with respect to an imaging surface in accordance with the stage driving during the arrangement process, the control unit obtains a plurality of first sub-pixel shift images corresponding to the plurality of states, and inspects the imprint process based on the plurality of first sub-pixel shift images.

16 Claims, 10 Drawing Sheets

IMPRINT APPARATUS AND ARTICLE MANUFACTURING METHOD

BACKGROUND OF THE INVENTION

Field of the Invention

The present invention relates to an imprint apparatus and an article manufacturing method.

Description of the Related Art

As a lithography technique for manufacturing a device such as a semiconductor device, there is known an imprint technique for molding an imprint material on a substrate using a mold. An imprint apparatus using the imprint technique can form a pattern of an imprint material on a substrate by curing the imprint material in a state in which a mold and the imprint material on the substrate are in contact with each other, and releasing the mold from the cured imprint material.

On the other hand, Japanese Patent No. 6896036 and Japanese Patent Laid-Open No. 2013-542468 propose techniques concerning inspection of the pattern of the imprint material thus formed on the substrate. Japanese Patent No. 6896036 discloses a technique for inspecting a defect existing in the pattern of the imprint material formed on the substrate. In this technique, a high magnification microscope is used to inspect about 1/500 of a shot region (imprint region) on the substrate where the pattern of the imprint material is formed by one process (imprint process). Furthermore, Japanese Patent Laid-Open No. 2013-542468 discloses a scanning microscope using a sub-pixel shift technique, and also discloses an image process capable of creating a high-resolution image (sub-pixel image).

However, in the technique disclosed in Japanese Patent No. 6896036, since the visual field (inspection field) of the high magnification microscope is narrow, it takes a long time to inspect the entire imprint region. Furthermore, the technique disclosed in Japanese Patent Laid-Open No. 2013-542468 requires a large memory area and computer operation capability to process the whole sub-pixel image.

SUMMARY OF THE INVENTION

The present invention provides a technique advantageous in accurately inspecting an imprint process of forming a pattern of an imprint material on a substrate using a mold within a short time.

According to one aspect of the present invention, there is provided an imprint apparatus for performing an imprint process of forming a pattern of an imprint material on a substrate using a mold, including a stage configured to be driven while holding the substrate, a dispenser configured to arrange the imprint material on the substrate, an imaging unit provided above the mold and configured to obtain an image by capturing, on an imaging surface, the substrate held by the stage, and a control unit configured to control a process concerning inspection of the imprint process, wherein the imprint process includes an arrangement process including stage driving of driving the stage between a first position below the mold and a second position below the dispenser to arrange the imprint material in a shot region on the substrate, and in a case where a plurality of states are obtained, in each of which the shot region is sub-pixel shifted with respect to the imaging surface in accordance with the stage driving during the arrangement process in the process, the control unit obtains a plurality of first sub-pixel shift images corresponding to the plurality of states by causing the imaging unit to capture the shot region, and inspects the imprint process based on the plurality of first sub-pixel shift images.

Further features of the present invention will become apparent from the following description of exemplary embodiments with reference to the attached drawings.

BRIEF DESCRIPTION OF THE DRAWINGS

FIG. 3 is a view showing a simulatively created inspection image.

FIG. 4 shows views of the positional relationship between an inspection image and sensor pixels in sub-pixel shift imaging.

DESCRIPTION OF THE EMBODIMENTS

Figure 1:
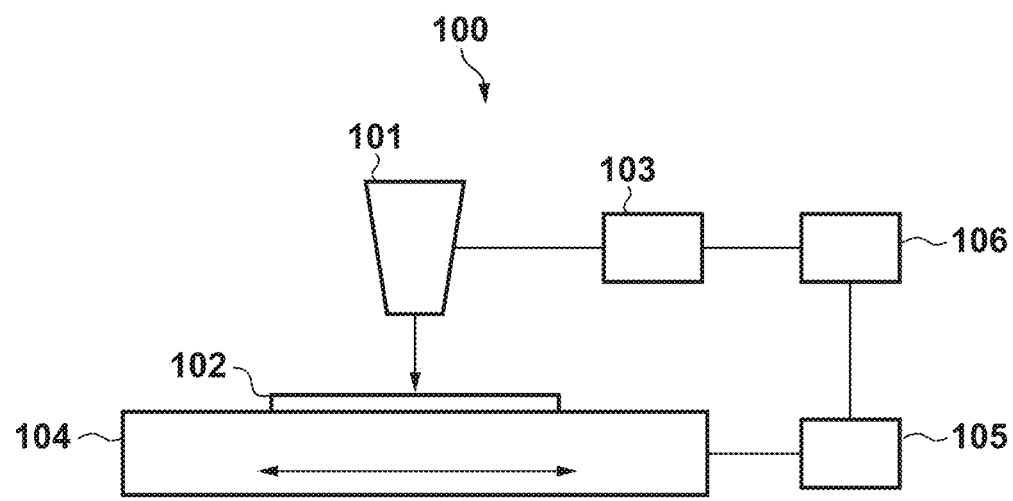
FIG. 1 is a schematic view illustrating configurations of an inspection apparatus according to a first embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

First Embodiment

FIG. 1 is a schematic view illustrating configurations of an inspection apparatus 100 according to the first embodiment. The inspection apparatus 100 is an apparatus that inspects an inspection target 102, for example, the presence/absence of a defect in the inspection target 102. The inspection apparatus 100 includes an imaging unit 101, an image storage unit 103, a stage 104, a position storage unit 105, and a control unit 106.

The imaging unit 101 includes, for example, a CCD camera, and obtains an inspection image by capturing the inspection target 102 on an imaging surface. In this embodiment, as the inspection target 102, a plurality of identical articles, for example, articles having the same appearance such as mass production components or dies manufactured adjacent to each other on a semiconductor wafer are assumed as long as they are good quality articles. The image storage unit 103 includes, for example, a computer for image storage, and stores (saves) the inspection image obtained by the imaging unit 101. The stage 104 is a stage that is driven while holding the inspection target 102. In this embodiment, the stage 104 is configured to be driven in a direction parallel to the imaging surface (sensor surface) of the imaging unit 101. The position storage unit 105 includes, for example, a computer for position storage, and stores (saves), as an inspection position, the position of the stage 104 when the imaging unit 101 captures the inspection target 102. The control unit 106 controls the respective units of the inspection apparatus 100 to operate the inspection apparatus 100. In this embodiment, the control unit 106 includes a computer for analysis, and has a function of analyzing the inspection image stored in the image storage unit 103 and the inspection position stored in the position storage unit 105 and controlling a process concerning inspection of the inspection target 102.

Figure 2:
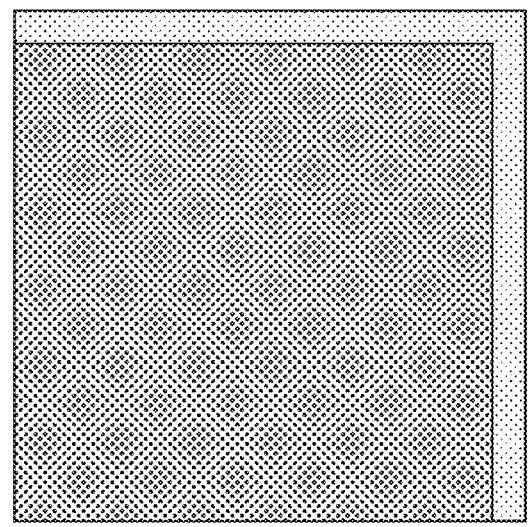
FIG. 2 is a view showing an example of an inspection image obtained by an imaging unit.

FIG. 2 is a view showing an example of the inspection image obtained by the imaging unit 101. In this embodiment, the imaging unit 101 obtains the inspection image shown in FIG. 2 by capturing an inspection region of 9×9 mm of the inspection target 102 on the imaging surface formed by 300×300 pixels. Therefore, the imaging unit 101 (imaging surface) has a spatial resolution of 30 μm.

A method (a process concerning inspection of the inspection target 102) in which if, for example, a defect is detected (confirmed) in the inspection image shown in FIG. 2, the position of the defect is specified with the spatial resolution (sensor spatial resolution) of the imaging unit 101 or lower will be described below. First, an image obtained by capturing a good quality article identical to the inspection target 102 by the imaging unit 101 is stored as a reference image in the image storage unit 103. Next, an image obtained by capturing the inspection target 102 by the imaging unit 101 under the same imaging condition is stored as an inspection image in the image storage unit 103. Then, the difference between the reference image and the inspection image stored in the image storage unit 103 is evaluated. If the difference is equal to or smaller than a determination value (threshold value), the inspection target 102 is determined as a good quality article; otherwise, the inspection target 102 is determined as a defective article. With respect to the defective article, a sub-pixel shift image process is performed for a partial image (pixels) near a portion where the difference between the reference image and the inspection image exceeds the determination value, thereby specifying the position of the defect with the sensor spatial resolution or lower. This makes it possible to investigate details of the cause of the defect, thereby contributing to improvement of the quality of the inspection target 102.

Figure 3:
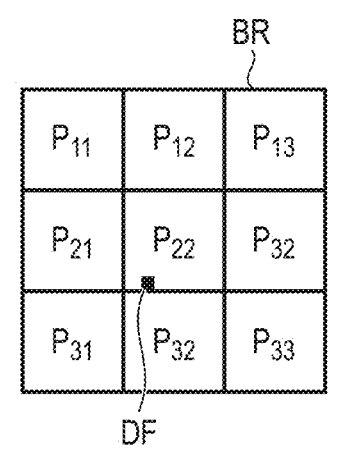

FIG. 3 is a view showing a simulatively created inspection image. Assume that a pixel $P_{22}$ at the center of the inspection image is a pixel in which the difference between the reference image and the detection image exceeds the determination value (that is, a defect exists), as shown in FIG. 3. In this embodiment, a sub-pixel shift image process is performed for 3×3 pixels (a region of 90×90 μm) including the pixel $P_{22}$ and eight pixels $P_{11}$, $P_{12}$, $P_{13}$, $P_{21}$, $P_{23}$, $P_{31}$, $P_{32}$, and $P_{33}$ around (in the up-and-down, left-and-right, and diagonal directions of) the pixel $P_{22}$.

FIG. 3 shows a boundary BR of the pixels (sensor pixels) of the imaging surface of the imaging unit 101 with respect to the inspection image. In this example, a defect DF with a side of 1 μm, which is indicated by a black point, exists in (inside) the central pixel $P_{22}$. The luminance of the defect DF is 100 levels lower (darker) than the luminance of the periphery (to be referred to as a "background" hereinafter), on which there is no defect DF, in a 8-bit, 256-level grayscale, and is 1,600 levels lower than the luminance of the background in a 12-bit, 4096-level grayscale. In this embodiment, to avoid cancellation of significant digits to be described later, the 12-bit data format is used.

In the inspection image shown in FIG. 3, the luminance of the background is 2,400 (150 in the 256-level grayscale), and the luminance of the defect DF is 800 (50 in the 256-level grayscale). As the luminance is higher, a white image is obtained, and as the luminance is lower, a black image is obtained. Since the central pixel $P_{22}$ includes the defect DF with a luminance of 800 and an area of 1 μm² (the area of the background is 899 μm² obtained by excluding the area of the defect DF), the measurement value (sensor measurement value) is given by:

$$\frac{(800*1 + 2400*899)}{900} = 2398$$

This sensor measurement value corresponds to a luminance of 149.8889 in the 256-level data format. Therefore, cancellation of significant digits occurs in the luminance of the pixel $P_{22}$ to result in 150. On the other hand, since the luminance of the peripheral pixels $P_{11}$, $P_{12}$, $P_{13}$, $P_{21}$, $P_{23}$, $P_{31}$, $P_{32}$, and $P_{33}$ without including the defect DF is also 150, it is impossible to detect the defect DF existing in the pixel $P_{22}$ in the 8-bit format. To cope with this, in this embodiment, the 12-bit data format is used, as described above.

With respect to the inspection image shown in FIG. 3, the sensor measurement values are given by:

$$\begin{bmatrix} P_{11} & P_{12} & P_{13} \\ P_{21} & P_{22} & P_{23} \\ P_{31} & P_{32} & P_{33} \end{bmatrix} = \begin{bmatrix} 2400 & 2400 & 2400 \\ 2400 & 2398 & 2400 \\ 2400 & 2400 & 2400 \end{bmatrix}$$

Note that $P_{ij}$ represents a pixel on the ith row from above and the jth column from the left.

For example, if the determination condition of the defect DF is that "at least 2 levels lower than in the background", it is determined that there exists the defect DF in the pixel $P_{22}$ and there is no defect DF in the remaining pixels $P_{11}$, $P_{12}$, $P_{13}$, $P_{21}$, $P_{23}$, $P_{31}$, $P_{32}$, and $P_{33}$.

The inspection image normally includes about 2% of noise (white noise and the like), and the noise corresponds to a luminance of 82 in the 12-bit, 4096-level grayscale, which is much higher than the determination condition of the defect DF. Therefore, in this state, it is impossible to detect the defect DF existing in the pixel $P_{22}$ due to the influence of the noise.

To cope with this, in this embodiment, the influence of the noise is reduced by an averaging effect by continuously capturing the same point of the inspection target 102. More specifically, 10,000 images obtained by continuously capturing the same point of the inspection target 102 for 50 sec using, as the imaging unit 101, a general CCD camera that can capture 200 images per sec are averaged, thereby obtaining an inspection image. This reduces noise included in the inspection image to $\frac{1}{100}$ and obtains a luminance of about 0.82, thereby making it possible to normally detect the defect DF existing in the pixel $P_{22}$. Note that in fact, it is possible to similarly obtain the averaging effect by increasing the sensor accumulation time by 10,000 times instead of increasing the number of times of capturing of the inspection target 102. Averaging of the inspection image by continuously capturing the same point of the inspection target 102 or by prolonging the sensor accumulation time will be referred to as "averaging imaging" hereinafter.

In this embodiment, 1/10 sub-pixel shift imaging is performed. More specifically, after averaging imaging is performed for an arbitrary point of a target of $\frac{1}{10}$ ub-pixel shift imaging, the stage 104 that holds the target is driven by $\frac{1}{10}$ pixel in a diagonal direction, and averaging imaging is performed for a new point (a point shifted by $\frac{1}{10}$ pixel) of the target. Such averaging imaging and driving of the stage 104 are repeated 10 times for each of the inspection target 102 and a good quality article (reference target) identical to the inspection target 102. Thus, 10 averaged reference images and 10 inspection images are obtained.

In this embodiment, to reduce the calculation load, a sub-pixel image process is performed not for the whole image of 300×300 pixels but for only nine pixels including the pixel $P_{22}$ where the defect DF has been detected and the eight pixels around the pixel $P_{22}$.

Figure 4:
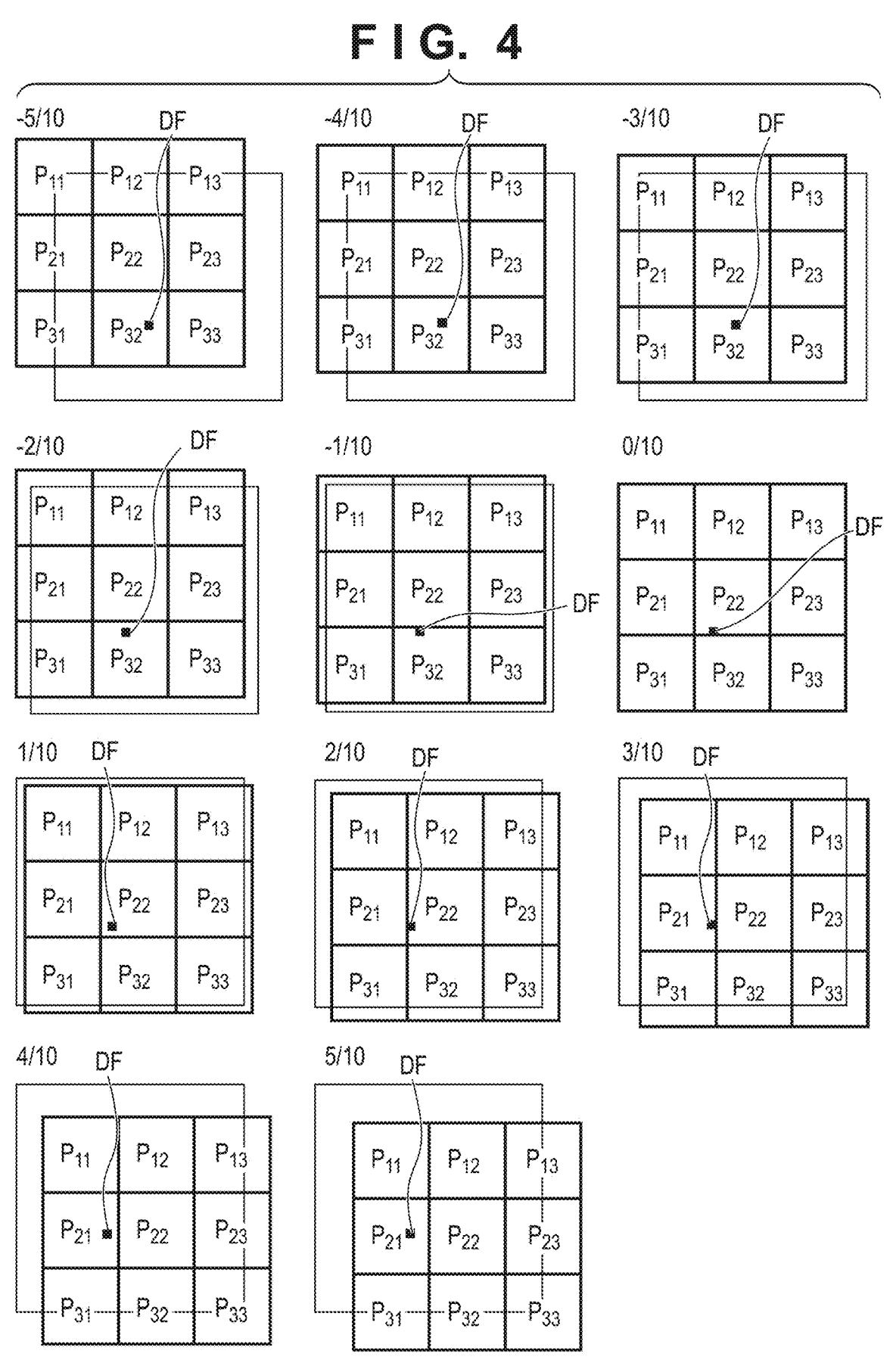

FIG. 4 shows views of the positional relationship between the inspection image (FIG. 3) and the sensor pixels in sub-pixel shift imaging. In FIG. 4, a numerical value of k/10 (k: integer of −5 to 5) represents a driving amount (sub-pixel shift amount) in the diagonal direction with respect to the original position (0/10). In sub-pixel shift imaging, the sensor measurement value in each pixel of the imaging unit 101 is as follows. Note that in the following equations, $S_k P_{ij}$ represents a pixel on the ith row from above and the jth column from the left in k/10 sub-pixel shift imaging. Note that a region outside the inspection image (a region extending from the inspection image) has a luminance of 2,400, similar to the background.

$$\begin{bmatrix} S_{-5}P_{11} & S_{-5}P_{12} & S_{-5}P_{13} \\ S_{-5}P_{21} & S_{-5}P_{22} & S_{-5}P_{23} \\ S_{-5}P_{31} & S_{-5}P_{32} & S_{-5}P_{33} \end{bmatrix} = \begin{bmatrix} 2400 & 2400 & 2400 \\ 2400 & 2400 & 2400 \\ 2400 & 2398 & 2400 \end{bmatrix}$$

$$\begin{bmatrix} S_{-4}P_{11} & S_{-4}P_{12} & S_{-4}P_{13} \\ S_{-4}P_{21} & S_{-4}P_{22} & S_{-4}P_{23} \\ S_{-4}P_{31} & S_{-4}P_{32} & S_{-4}P_{33} \end{bmatrix} = \begin{bmatrix} 2400 & 2400 & 2400 \\ 2400 & 2400 & 2400 \\ 2400 & 2398 & 2400 \end{bmatrix}$$

$$\begin{bmatrix} S_{-3}P_{11} & S_{-3}P_{12} & S_{-3}P_{13} \\ S_{-3}P_{21} & S_{-3}P_{22} & S_{-3}P_{23} \\ S_{-3}P_{31} & S_{-3}P_{32} & S_{-3}P_{33} \end{bmatrix} = \begin{bmatrix} 2400 & 2400 & 2400 \\ 2400 & 2400 & 2400 \\ 2400 & 2398 & 2400 \end{bmatrix}$$

$$\begin{bmatrix} S_{-2}P_{11} & S_{-2}P_{12} & S_{-2}P_{13} \\ S_{-2}P_{21} & S_{-2}P_{22} & S_{-2}P_{23} \\ S_{-2}P_{31} & S_{-2}P_{32} & S_{-2}P_{33} \end{bmatrix} = \begin{bmatrix} 2400 & 2400 & 2400 \\ 2400 & 2400 & 2400 \\ 2400 & 2398 & 2400 \end{bmatrix}$$

$$\begin{bmatrix} S_{-1}P_{11} & S_{-1}P_{12} & S_{-1}P_{13} \\ S_{-1}P_{21} & S_{-1}P_{22} & S_{-1}P_{23} \\ S_{-1}P_{31} & S_{-1}P_{32} & S_{-1}P_{33} \end{bmatrix} = \begin{bmatrix} 2400 & 2400 & 2400 \\ 2400 & 2400 & 2400 \\ 2400 & 2398 & 2400 \end{bmatrix}$$

-continued $$\begin{bmatrix} S_0 P_{11} & S_0 P_{12} & S_0 P_{13} \\ S_0 P_{21} & S_0 P_{22} & S_0 P_{23} \\ S_0 P_{31} & S_0 P_{32} & S_0 P_{33} \end{bmatrix} = \begin{bmatrix} 2400 & 2400 & 2400 \\ 2400 & 2398 & 2400 \\ 2400 & 2400 & 2400 \end{bmatrix}$$

$$\begin{bmatrix} S_1 P_{11} & S_1 P_{12} & S_1 P_{13} \\ S_1 P_{21} & S_1 P_{22} & S_1 P_{23} \\ S_1 P_{31} & S_1 P_{32} & S_1 P_{33} \end{bmatrix} = \begin{bmatrix} 2400 & 2400 & 2400 \\ 2400 & 2398 & 2400 \\ 2400 & 2400 & 2400 \end{bmatrix}$$

$$\begin{bmatrix} S_2 P_{11} & S_2 P_{12} & S_2 P_{13} \\ S_2 P_{21} & S_2 P_{22} & S_2 P_{23} \\ S_2 P_{31} & S_2 P_{32} & S_2 P_{33} \end{bmatrix} = \begin{bmatrix} 2400 & 2400 & 2400 \\ 2400 & 2398 & 2400 \\ 2400 & 2400 & 2400 \end{bmatrix}$$

$$\begin{bmatrix} S_3 P_{11} & S_3 P_{12} & S_3 P_{13} \\ S_3 P_{21} & S_3 P_{22} & S_3 P_{23} \\ S_3 P_{31} & S_3 P_{32} & S_3 P_{33} \end{bmatrix} = \begin{bmatrix} 2400 & 2400 & 2400 \\ 2398 & 2400 & 2400 \\ 2400 & 2400 & 2400 \end{bmatrix}$$

$$\begin{bmatrix} S_4 P_{11} & S_4 P_{12} & S_4 P_{13} \\ S_4 P_{21} & S_4 P_{22} & S_4 P_{23} \\ S_4 P_{31} & S_4 P_{32} & S_4 P_{33} \end{bmatrix} = \begin{bmatrix} 2400 & 2400 & 2400 \\ 2398 & 2400 & 2400 \\ 2400 & 2400 & 2400 \end{bmatrix}$$

$$\begin{bmatrix} S_5 P_{11} & S_5 P_{12} & S_5 P_{13} \\ S_5 P_{21} & S_5 P_{22} & S_5 P_{23} \\ S_5 P_{31} & S_5 P_{32} & S_5 P_{33} \end{bmatrix} = \begin{bmatrix} 2400 & 2400 & 2400 \\ 2398 & 2400 & 2400 \\ 2400 & 2400 & 2400 \end{bmatrix}$$

Referring to FIG. 4, it is known that the defect DF exists in the pixel $P_{32}$ on the central lower side in −5/10 sub-pixel shift imaging to −1/10 sub-pixel shift imaging. It is known that the defect DF exists in the central pixel $P_{22}$ in 0/10 sub-pixel shift imaging to $\frac{2}{10}$ sub-pixel shift imaging (the defect DF shifts from the pixel $P_{32}$ to the pixel $P_{22}$). It is known that the defect DF exists in the pixel $P_{21}$ on the central left side in $\frac{3}{10}$ sub-pixel shift imaging to $\frac{5}{10}$ sub-pixel shift imaging (the defect DF shifts from the pixel $P_{22}$ to the pixel $P_{21}$). This phenomenon can also be confirmed from the above-described sensor measurement values. Note that for the sake of easy understanding, the pixel where the defect DF exists and its sensor measurement value are hatched.

Figure 5:
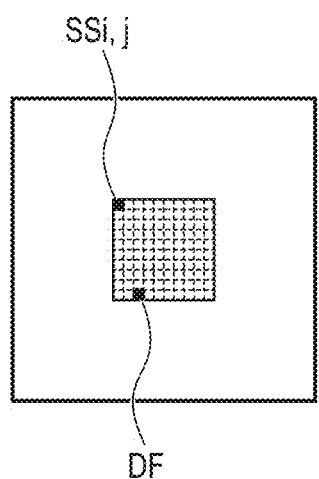
FIG. 5 is a view showing sub-pixels obtained by dividing one pixel by 10.

FIG. 5 is a view showing sub-pixels obtained by dividing the pixel $P_{22}$ by 10. A sub-pixel on the ith row from above and the jth column from the left is represented by $SS_{i,j}$. Referring to FIG. 5, the defect DF exists in the sub-pixel $SS_{10,3}$. From the sensor measurement value $S_0 P_{22}$, the presence of the defect DF in the pixel $P_{22}$ is known but the position in the pixel is not known (the position in the pixel $P_{22}$ where the defect DF exists is not known). Attention is now paid to the hatched sub-pixel $SS_{1,1}$ at the upper left position in FIG. 5.

Figure 6:
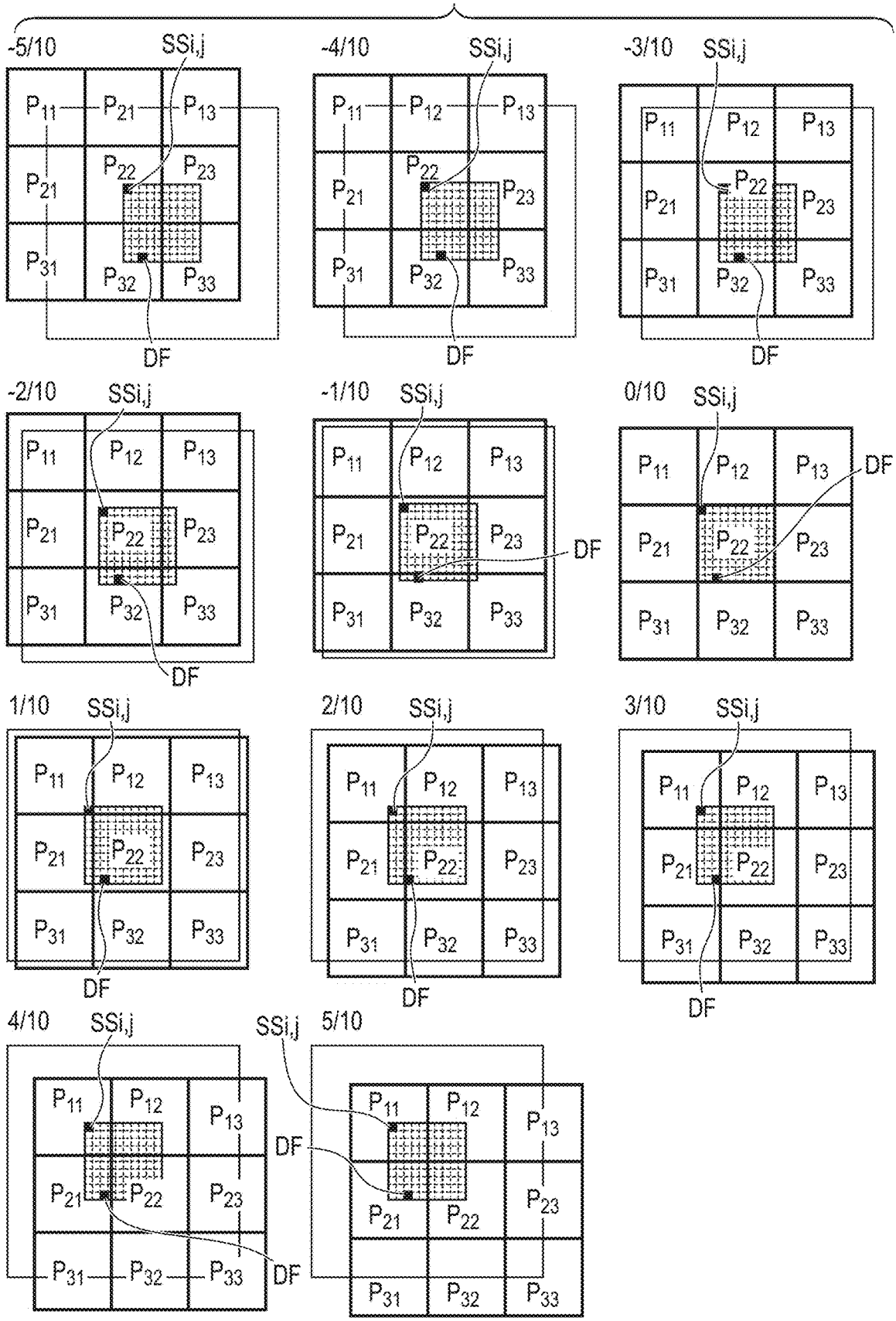
FIG. 6 shows views of the positional relationship between the inspection image and a sub-pixel in sub-pixel shift imaging.

FIG. 6 shows views of the positional relationship between the inspection image (FIG. 3) and the sub-pixel $SS_{1,1}$ in sub-pixel shift imaging. Referring to FIG. 6, the sub-pixel $SS_{1,1}$ contributes to measurement of the pixel $P_{22}$ in −5/10 sub-pixel shift imaging to 0/10 sub-pixel shift imaging. The sub-pixel $SS_{1,1}$ contributes to measurement of the pixel $P_{11}$ in 1/10 sub-pixel shift imaging to 5/10 sub-pixel shift imaging. This can be expressed by the first row of the right-hand side. The remaining sub-pixels can also be represented in a similar manner. Note that a pixel where the defect DF exists is similarly hatched.

$$\begin{bmatrix} SS_{1,1} \\ SS_{2,1} \\ SS_{3,1} \\ SS_{4,1} \\ SS_{5,1} \\ SS_{6,1} \\ SS_{7,1} \\ SS_{8,1} \\ SS_{9,1} \\ SS_{10,1} \end{bmatrix} = \begin{bmatrix} S_{-5}P_{22} & S_{-4}P_{22} & S_{-3}P_{22} & S_{-2}P_{22} & S_{-1}P_{22} & S_0P_{22} & S_1P_{11} & S_2P_{11} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{21} & S_2P_{11} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{21} & S_2P_{21} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{21} & S_2P_{21} & S_3P_{21} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{21} & S_2P_{21} & S_3P_{21} & S_4P_{21} & S_5P_{11} \\ S_{-5}P_{32} & S_{-4}P_{32} & S_{-3}P_{22} & S_{-2}P_{22} & S_{-1}P_{22} & S_0P_{22} & S_1P_{21} & S_2P_{21} & S_3P_{21} & S_4P_{21} & S_5P_{21} \\ S_{-5}P_{32} & S_{-4}P_{32} & S_{-3}P_{32} & S_{-2}P_{22} & S_{-1}P_{22} & S_0P_{22} & S_1P_{21} & S_2P_{21} & S_3P_{21} & S_4P_{21} & S_5P_{21} \\ S_{-5}P_{32} & S_{-4}P_{32} & S_{-3}P_{32} & S_{-2}P_{32} & S_{-1}P_{22} & S_0P_{22} & S_1P_{21} & S_2P_{21} & S_3P_{21} & S_4P_{21} & S_5P_{21} \\ S_{-5}P_{32} & S_{-4}P_{32} & S_{-3}P_{32} & S_{-2}P_{32} & S_{-1}P_{22} & S_0P_{22} & S_1P_{21} & S_2P_{21} & S_3P_{21} & S_4P_{21} & S_5P_{21} \\ S_{-5}P_{32} & S_{-4}P_{32} & S_{-3}P_{32} & S_{-2}P_{32} & S_{-1}P_{32} & S_0P_{22} & S_1P_{21} & S_2P_{21} & S_3P_{21} & S_4P_{21} & S_5P_{21} \end{bmatrix}$$

$$\begin{bmatrix} SS_{1,2} \\ SS_{2,2} \\ SS_{3,2} \\ SS_{4,2} \\ SS_{5,2} \\ SS_{6,2} \\ SS_{7,2} \\ SS_{8,2} \\ SS_{9,2} \\ SS_{10,2} \end{bmatrix} = \begin{bmatrix} S_{-5}P_{22} & S_{-4}P_{22} & S_{-3}P_{22} & S_{-2}P_{22} & S_{-1}P_{22} & S_0P_{22} & S_1P_{12} & S_2P_{11} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{11} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{21} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{21} & S_3P_{21} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{21} & S_3P_{21} & S_4P_{21} & S_5P_{11} \\ S_{-5}P_{32} & S_{-4}P_{32} & S_{-3}P_{22} & S_{-2}P_{22} & S_{-1}P_{22} & S_0P_{22} & S_1P_{22} & S_2P_{21} & S_3P_{21} & S_4P_{21} & S_5P_{21} \\ S_{-5}P_{32} & S_{-4}P_{32} & S_{-3}P_{22} & S_{-2}P_{22} & S_{-1}P_{22} & S_0P_{22} & S_1P_{22} & S_2P_{21} & S_3P_{21} & S_4P_{21} & S_5P_{21} \\ S_{-5}P_{32} & S_{-4}P_{32} & S_{-3}P_{32} & S_{-2}P_{22} & S_{-1}P_{22} & S_0P_{22} & S_1P_{22} & S_2P_{21} & S_3P_{21} & S_4P_{21} & S_5P_{21} \\ S_{-5}P_{32} & S_{-4}P_{32} & S_{-3}P_{32} & S_{-2}P_{32} & S_{-1}P_{22} & S_0P_{22} & S_1P_{22} & S_2P_{21} & S_3P_{21} & S_4P_{21} & S_5P_{21} \\ S_{-5}P_{32} & S_{-4}P_{32} & S_{-3}P_{32} & S_{-2}P_{32} & S_{-1}P_{32} & S_0P_{22} & S_1P_{22} & S_2P_{21} & S_3P_{21} & S_4P_{21} & S_5P_{21} \end{bmatrix}$$

$$\begin{bmatrix} SS_{1,3} \\ SS_{2,3} \\ SS_{3,3} \\ SS_{4,3} \\ SS_{5,3} \\ SS_{6,3} \\ SS_{7,3} \\ SS_{8,3} \\ SS_{9,3} \\ SS_{10,3} \end{bmatrix} = \begin{bmatrix} S_{-5}P_{22} & S_{-4}P_{22} & S_{-3}P_{22} & S_{-2}P_{22} & S_{-1}P_{22} & S_0P_{22} & S_1P_{12} & S_2P_{12} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{12} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{11} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{21} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{21} & S_4P_{21} & S_5P_{11} \\ S_{-5}P_{32} & S_{-4}P_{32} & S_{-3}P_{22} & S_{-2}P_{22} & S_{-1}P_{22} & S_0P_{22} & S_1P_{22} & S_2P_{22} & S_3P_{21} & S_4P_{21} & S_5P_{21} \\ S_{-5}P_{32} & S_{-4}P_{32} & S_{-3}P_{22} & S_{-2}P_{22} & S_{-1}P_{22} & S_0P_{22} & S_1P_{22} & S_2P_{22} & S_3P_{21} & S_4P_{21} & S_5P_{21} \\ S_{-5}P_{32} & S_{-4}P_{32} & S_{-3}P_{32} & S_{-2}P_{22} & S_{-1}P_{22} & S_0P_{22} & S_1P_{22} & S_2P_{22} & S_3P_{21} & S_4P_{21} & S_5P_{21} \\ S_{-5}P_{32} & S_{-4}P_{32} & S_{-3}P_{32} & S_{-2}P_{32} & S_{-1}P_{22} & S_0P_{22} & S_1P_{22} & S_2P_{22} & S_3P_{21} & S_4P_{21} & S_5P_{21} \\ S_{-5}P_{32} & S_{-4}P_{32} & S_{-3}P_{32} & S_{-2}P_{32} & S_{-1}P_{32} & S_0P_{22} & S_1P_{22} & S_2P_{22} & S_3P_{21} & S_4P_{21} & S_5P_{21} \end{bmatrix}$$

$$\begin{bmatrix} SS_{1,4} \\ SS_{2,4} \\ SS_{3,4} \\ SS_{4,4} \\ SS_{5,4} \\ SS_{6,4} \\ SS_{7,4} \\ SS_{8,4} \\ SS_{9,4} \\ SS_{10,4} \end{bmatrix} = \begin{bmatrix} S_{-5}P_{22} & S_{-4}P_{22} & S_{-3}P_{22} & S_{-2}P_{22} & S_{-1}P_{22} & S_0P_{22} & S_1P_{12} & S_2P_{12} & S_3P_{12} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{12} & S_3P_{12} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{12} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{22} & S_4P_{11} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{22} & S_4P_{21} & S_5P_{11} \\ S_{-5}P_{32} & S_{-4}P_{32} & S_{-3}P_{22} & S_{-2}P_{22} & S_{-1}P_{22} & S_0P_{22} & S_1P_{22} & S_2P_{22} & S_3P_{22} & S_4P_{21} & S_5P_{21} \\ S_{-5}P_{32} & S_{-4}P_{32} & S_{-3}P_{22} & S_{-2}P_{22} & S_{-1}P_{22} & S_0P_{22} & S_1P_{22} & S_2P_{22} & S_3P_{22} & S_4P_{21} & S_5P_{21} \\ S_{-5}P_{32} & S_{-4}P_{32} & S_{-3}P_{32} & S_{-2}P_{22} & S_{-1}P_{22} & S_0P_{22} & S_1P_{22} & S_2P_{22} & S_3P_{22} & S_4P_{21} & S_5P_{21} \\ S_{-5}P_{32} & S_{-4}P_{32} & S_{-3}P_{32} & S_{-2}P_{32} & S_{-1}P_{22} & S_0P_{22} & S_1P_{22} & S_2P_{22} & S_3P_{22} & S_4P_{21} & S_5P_{21} \\ S_{-5}P_{32} & S_{-4}P_{32} & S_{-3}P_{32} & S_{-2}P_{32} & S_{-1}P_{32} & S_0P_{22} & S_1P_{22} & S_2P_{22} & S_3P_{22} & S_4P_{21} & S_5P_{21} \end{bmatrix}$$

$$\begin{bmatrix} SS_{1,5} \\ SS_{2,5} \\ SS_{3,5} \\ SS_{4,5} \\ SS_{5,5} \\ SS_{6,5} \\ SS_{7,5} \\ SS_{8,5} \\ SS_{9,5} \\ SS_{10,5} \end{bmatrix} = \begin{bmatrix} S_{-5}P_{22} & S_{-4}P_{22} & S_{-3}P_{22} & S_{-2}P_{22} & S_{-1}P_{22} & S_0P_{22} & S_1P_{12} & S_2P_{12} & S_3P_{12} & S_4P_{12} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{12} & S_3P_{12} & S_4P_{12} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{12} & S_4P_{12} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{22} & S_4P_{12} & S_5P_{11} \\ S_{-5}P_{22} & S_{-4}P_{22} & S_{-3}P_{22} & S_{-2}P_{22} & S_{-1}P_{22} & S_0P_{22} & S_1P_{22} & S_2P_{22} & S_3P_{22} & S_4P_{22} & S_5P_{11} \\ S_{-5}P_{32} & S_{-4}P_{32} & S_{-3}P_{22} & S_{-2}P_{22} & S_{-1}P_{22} & S_0P_{22} & S_1P_{22} & S_2P_{22} & S_3P_{22} & S_4P_{22} & S_5P_{21} \\ S_{-5}P_{32} & S_{-4}P_{32} & S_{-3}P_{22} & S_{-2}P_{22} & S_{-1}P_{22} & S_0P_{22} & S_1P_{22} & S_2P_{22} & S_3P_{22} & S_4P_{22} & S_5P_{21} \\ S_{-5}P_{32} & S_{-4}P_{32} & S_{-3}P_{32} & S_{-2}P_{22} & S_{-1}P_{22} & S_0P_{22} & S_1P_{22} & S_2P_{22} & S_3P_{22} & S_4P_{22} & S_5P_{21} \\ S_{-5}P_{32} & S_{-4}P_{32} & S_{-3}P_{32} & S_{-2}P_{32} & S_{-1}P_{22} & S_0P_{22} & S_1P_{22} & S_2P_{22} & S_3P_{22} & S_4P_{22} & S_5P_{21} \\ S_{-5}P_{32} & S_{-4}P_{32} & S_{-3}P_{32} & S_{-2}P_{32} & S_{-1}P_{32} & S_0P_{22} & S_1P_{22} & S_2P_{22} & S_3P_{22} & S_4P_{22} & S_5P_{21} \end{bmatrix}$$

$$\begin{bmatrix} SS_{1,6} \\ SS_{2,6} \\ SS_{3,6} \\ SS_{4,6} \\ SS_{5,6} \\ SS_{6,6} \\ SS_{7,6} \\ SS_{8,6} \\ SS_{9,6} \\ SS_{10,6} \end{bmatrix} = \begin{bmatrix} S_{-5}P_{23} & S_{-4}P_{22} & S_{-3}P_{22} & S_{-2}P_{22} & S_{-1}P_{22} & S_0P_{22} & S_1P_{12} & S_2P_{12} & S_3P_{12} & S_4P_{12} & S_5P_{12} \\ S_{-5}P_{23} & S_{-4}P_{22} & S_{-3}P_{22} & S_{-2}P_{22} & S_{-1}P_{22} & S_0P_{22} & S_1P_{22} & S_2P_{12} & S_3P_{12} & S_4P_{12} & S_5P_{12} \\ S_{-5}P_{23} & S_{-4}P_{22} & S_{-3}P_{22} & S_{-2}P_{22} & S_{-1}P_{22} & S_0P_{22} & S_1P_{22} & S_2P_{22} & S_3P_{12} & S_4P_{12} & S_5P_{12} \\ S_{-5}P_{23} & S_{-4}P_{22} & S_{-3}P_{22} & S_{-2}P_{22} & S_{-1}P_{22} & S_0P_{22} & S_1P_{22} & S_2P_{22} & S_3P_{22} & S_4P_{12} & S_5P_{12} \\ S_{-5}P_{23} & S_{-4}P_{22} & S_{-3}P_{22} & S_{-2}P_{22} & S_{-1}P_{22} & S_0P_{22} & S_1P_{22} & S_2P_{22} & S_3P_{22} & S_4P_{22} & S_5P_{12} \\ S_{-5}P_{33} & S_{-4}P_{32} & S_{-3}P_{22} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{32} & S_{-3}P_{22} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{32} & S_{-3}P_{32} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{32} & S_{-3}P_{32} & S_{-2}P_{32} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{32} & S_{-3}P_{32} & S_{-2}P_{32} & S_{-1}P_{32} & S_0P_{22} & S_1P_{22} & S_2P_{22} & S_3P_{22} & S_4P_{22} & S_5P_{22} \end{bmatrix}$$

-continued $$\begin{bmatrix} SS_{1,7} \\ SS_{2,7} \\ SS_{3,7} \\ SS_{4,7} \\ SS_{5,7} \\ SS_{6,7} \\ SS_{7,7} \\ SS_{8,7} \\ SS_{9,7} \\ SS_{10,7} \end{bmatrix} = \begin{bmatrix} S_{-5}P_{23} & S_{-4}P_{23} & S_{-3}P_{22} & S_{-2}P_{22} & S_{-1}P_{22} & S_0P_{22} & S_1P_{12} & S_2P_{12} & S_3P_{12} & S_4P_{12} & S_5P_{12} \\ S_{-5}P_{23} & S_{-4}P_{23} & S_{-3}P_{22} & S_{-2}P_{22} & S_{-1}P_{22} & S_0P_{22} & S_1P_{12} & S_2P_{12} & S_3P_{12} & S_4P_{12} & S_5P_{12} \\ S_{-5}P_{23} & S_{-4}P_{23} & S_{-3}P_{22} & S_{-2}P_{22} & S_{-1}P_{22} & S_0P_{22} & S_1P_{22} & S_2P_{12} & S_3P_{12} & S_4P_{12} & S_5P_{12} \\ S_{-5}P_{23} & S_{-4}P_{23} & S_{-3}P_{22} & S_{-2}P_{22} & S_{-1}P_{22} & S_0P_{22} & S_1P_{22} & S_2P_{22} & S_3P_{22} & S_4P_{12} & S_5P_{12} \\ S_{-5}P_{23} & S_{-4}P_{23} & S_{-3}P_{22} & S_{-2}P_{22} & S_{-1}P_{22} & S_0P_{22} & S_1P_{22} & S_2P_{22} & S_3P_{22} & S_4P_{22} & S_5P_{12} \\ S_{-5}P_{33} & S_{-4}P_{33} & S_{-3}P_{22} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{22} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{32} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{32} & S_{-2}P_{32} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{32} & S_{-2}P_{32} & S_{-1}P_{32} & S_0P_{22} & S_1P_{22} & S_2P_{22} & S_3P_{22} & S_4P_{22} & S_5P_{22} \end{bmatrix}$$

$$\begin{bmatrix} SS_{1,8} \\ SS_{2,8} \\ SS_{3,8} \\ SS_{4,8} \\ SS_{5,8} \\ SS_{6,8} \\ SS_{7,8} \\ SS_{8,8} \\ SS_{9,8} \\ SS_{10,8} \end{bmatrix} = \begin{bmatrix} S_{-5}P_{23} & S_{-4}P_{23} & S_{-3}P_{23} & S_{-2}P_{22} & S_{-1}P_{22} & S_0P_{22} & S_1P_{12} & S_2P_{12} & S_3P_{12} & S_4P_{12} & S_5P_{12} \\ S_{-5}P_{23} & S_{-4}P_{23} & S_{-3}P_{23} & S_{-2}P_{22} & S_{-1}P_{22} & S_0P_{22} & S_1P_{22} & S_2P_{12} & S_3P_{12} & S_4P_{12} & S_5P_{12} \\ S_{-5}P_{23} & S_{-4}P_{23} & S_{-3}P_{23} & S_{-2}P_{22} & S_{-1}P_{22} & S_0P_{22} & S_1P_{22} & S_2P_{22} & S_3P_{12} & S_4P_{12} & S_5P_{12} \\ S_{-5}P_{23} & S_{-4}P_{23} & S_{-3}P_{23} & S_{-2}P_{22} & S_{-1}P_{22} & S_0P_{22} & S_1P_{22} & S_2P_{22} & S_3P_{22} & S_4P_{12} & S_5P_{12} \\ S_{-5}P_{23} & S_{-4}P_{23} & S_{-3}P_{23} & S_{-2}P_{22} & S_{-1}P_{22} & S_0P_{22} & S_1P_{22} & S_2P_{22} & S_3P_{22} & S_4P_{22} & S_5P_{12} \\ S_{-5}P_{33} & S_{-4}P_{33} & S_{-3}P_{23} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{23} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{22} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{32} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{32} & S_{-1}P_{32} & S_0P_{22} & S_1P_{22} & S_2P_{22} & S_3P_{22} & S_4P_{22} & S_5P_{22} \end{bmatrix}$$

$$\begin{bmatrix} SS_{1,9} \\ SS_{2,9} \\ SS_{3,9} \\ SS_{4,9} \\ SS_{5,9} \\ SS_{6,9} \\ SS_{7,9} \\ SS_{8,9} \\ SS_{9,9} \\ SS_{10,9} \end{bmatrix} = \begin{bmatrix} S_{-5}P_{23} & S_{-4}P_{23} & S_{-3}P_{23} & S_{-2}P_{23} & S_{-1}P_{22} & S_0P_{22} & S_1P_{12} & S_2P_{12} & S_3P_{12} & S_4P_{12} & S_5P_{12} \\ S_{-5}P_{23} & S_{-4}P_{23} & S_{-3}P_{23} & S_{-2}P_{23} & S_{-1}P_{22} & S_0P_{22} & S_1P_{22} & S_2P_{12} & S_3P_{12} & S_4P_{12} & S_5P_{12} \\ S_{-5}P_{23} & S_{-4}P_{23} & S_{-3}P_{23} & S_{-2}P_{23} & S_{-1}P_{22} & S_0P_{22} & S_1P_{22} & S_2P_{22} & S_3P_{12} & S_4P_{12} & S_5P_{12} \\ S_{-5}P_{23} & S_{-4}P_{23} & S_{-3}P_{23} & S_{-2}P_{23} & S_{-1}P_{22} & S_0P_{22} & S_1P_{22} & S_2P_{22} & S_3P_{22} & S_4P_{12} & S_5P_{12} \\ S_{-5}P_{23} & S_{-4}P_{23} & S_{-3}P_{23} & S_{-2}P_{23} & S_{-1}P_{22} & S_0P_{22} & S_1P_{22} & S_2P_{22} & S_3P_{22} & S_4P_{22} & S_5P_{12} \\ S_{-5}P_{33} & S_{-4}P_{33} & S_{-3}P_{23} & S_{-2}P_{23} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{23} & S_{-2}P_{23} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{23} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{33} & S_{-1}P_{22} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{33} & S_{-1}P_{32} & S_0P_{22} & S_1P_{22} & S_2P_{22} & S_3P_{22} & S_4P_{22} & S_5P_{22} \end{bmatrix}$$

$$\begin{bmatrix} SS_{1,10} \\ SS_{2,10} \\ SS_{3,10} \\ SS_{4,10} \\ SS_{5,10} \\ SS_{6,10} \\ SS_{7,10} \\ SS_{8,10} \\ SS_{9,10} \\ SS_{10,10} \end{bmatrix} = \begin{bmatrix} S_{-5}P_{23} & S_{-4}P_{23} & S_{-3}P_{23} & S_{-2}P_{23} & S_{-1}P_{23} & S_0P_{22} & S_1P_{12} & S_2P_{12} & S_3P_{12} & S_4P_{12} & S_5P_{12} \\ S_{-5}P_{23} & S_{-4}P_{23} & S_{-3}P_{23} & S_{-2}P_{23} & S_{-1}P_{23} & S_0P_{22} & S_1P_{22} & S_2P_{12} & S_3P_{12} & S_4P_{12} & S_5P_{12} \\ S_{-5}P_{23} & S_{-4}P_{23} & S_{-3}P_{23} & S_{-2}P_{23} & S_{-1}P_{23} & S_0P_{22} & S_1P_{22} & S_2P_{22} & S_3P_{12} & S_4P_{12} & S_5P_{12} \\ S_{-5}P_{23} & S_{-4}P_{23} & S_{-3}P_{23} & S_{-2}P_{23} & S_{-1}P_{23} & S_0P_{22} & S_1P_{22} & S_2P_{22} & S_3P_{22} & S_4P_{12} & S_5P_{12} \\ S_{-5}P_{23} & S_{-4}P_{23} & S_{-3}P_{23} & S_{-2}P_{23} & S_{-1}P_{23} & S_0P_{22} & S_1P_{22} & S_2P_{22} & S_3P_{22} & S_4P_{22} & S_5P_{12} \\ S_{-5}P_{33} & S_{-4}P_{33} & S_{-3}P_{23} & S_{-2}P_{23} & S_{-1}P_{23} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{23} & S_{-2}P_{23} & S_{-1}P_{23} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{23} & S_{-1}P_{23} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{33} & S_{-1}P_{23} & S_0P_{22} & S_1P_{22} & S_2P_{22} & S_3P_{22} & S_4P_{22} & S_5P_{22} \\ S_{-5}P_{33} & S_{-4}P_{33} & S_{-3}P_{33} & S_{-2}P_{33} & S_{-1}P_{33} & S_0P_{22} & S_1P_{22} & S_2P_{22} & S_3P_{22} & S_4P_{22} & S_5P_{22} \end{bmatrix}$$

By substituting the sensor measurement values into the above-described equations, the cumulative luminance values of the sub-pixels $SS_{i,j}$ are given by:

$$\begin{bmatrix} SS_{1,1} & SS_{1,2} & SS_{1,3} & SS_{1,4} & SS_{1,5} & SS_{1,6} & SS_{1,7} & SS_{1,8} & SS_{1,9} & SS_{1,10} \\ SS_{2,1} & SS_{2,2} & SS_{2,3} & SS_{2,4} & SS_{2,5} & SS_{2,6} & SS_{2,7} & SS_{2,8} & SS_{2,9} & SS_{2,10} \\ SS_{3,1} & SS_{3,2} & SS_{3,3} & SS_{3,4} & SS_{3,5} & SS_{3,6} & SS_{3,7} & SS_{3,8} & SS_{3,9} & SS_{3,10} \\ SS_{4,1} & SS_{4,2} & SS_{4,3} & SS_{4,4} & SS_{4,5} & SS_{4,6} & SS_{4,7} & SS_{4,8} & SS_{4,9} & SS_{4,10} \\ SS_{5,1} & SS_{5,2} & SS_{5,3} & SS_{5,4} & SS_{5,5} & SS_{5,6} & SS_{5,7} & SS_{5,8} & SS_{5,9} & SS_{5,10} \\ SS_{6,1} & SS_{6,2} & SS_{6,3} & SS_{6,4} & SS_{6,5} & SS_{6,6} & SS_{6,7} & SS_{6,8} & SS_{6,9} & SS_{6,10} \\ SS_{7,1} & SS_{7,2} & SS_{7,3} & SS_{7,4} & SS_{7,5} & SS_{7,6} & SS_{7,7} & SS_{7,8} & SS_{7,9} & SS_{7,10} \\ SS_{8,1} & SS_{8,2} & SS_{8,3} & SS_{8,4} & SS_{8,5} & SS_{8,6} & SS_{8,7} & SS_{8,8} & SS_{8,9} & SS_{8,10} \\ SS_{9,1} & SS_{9,2} & SS_{9,3} & SS_{9,4} & SS_{9,5} & SS_{9,6} & SS_{9,7} & SS_{9,8} & SS_{9,9} & SS_{9,10} \\ SS_{10,1} & SS_{10,2} & SS_{10,3} & SS_{10,4} & SS_{10,5} & SS_{10,6} & SS_{10,7} & SS_{10,8} & SS_{10,9} & SS_{10,10} \end{bmatrix} =$$

$$\begin{bmatrix} 26398 & 26398 & 26398 & 26398 & 26398 & 26398 & 26398 & 26398 & 26398 & 26398 \\ 26398 & 26396 & 26396 & 26396 & 26396 & 26396 & 26396 & 26396 & 26396 & 26396 \\ 26398 & 26396 & 26394 & 26394 & 26394 & 26394 & 26394 & 26394 & 26394 & 26394 \\ 26396 & 26394 & 26392 & 26394 & 26394 & 26394 & 26394 & 26394 & 26394 & 26394 \\ 26394 & 26392 & 26390 & 26392 & 26394 & 26394 & 26394 & 26394 & 26394 & 26394 \\ 26390 & 26388 & 26386 & 26388 & 26390 & 26394 & 26394 & 26394 & 26394 & 26394 \\ 26388 & 26386 & 26384 & 26386 & 26388 & 26392 & 26394 & 26394 & 26394 & 26394 \\ 26386 & 26384 & 26382 & 26384 & 26386 & 26390 & 26392 & 26394 & 26394 & 26394 \\ 26384 & 26382 & 26380 & 26382 & 26384 & 26388 & 26390 & 26392 & 26394 & 26394 \\ 26382 & 26380 & 26378 & 26380 & 26382 & 26386 & 26388 & 26390 & 26392 & 26394 \end{bmatrix}$$

Figure 7:
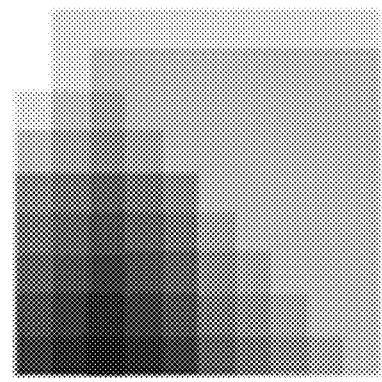
FIG. 7 is a view showing an image of sub-pixels of a pixel.

FIG. 7 is a view showing an image of the sub-pixels $SS_{i,j}$ of the pixel $P_{22}$ in a case where the minimum value and maximum value of the above-described cumulative luminance values are converted into 0 and 255, respectively. The values obtained by converting the cumulative luminance values of the sub-pixels $SS_{i,j}$ are given by:

$$\begin{bmatrix} SS_{1,1} & SS_{1,2} & SS_{1,3} & SS_{1,4} & SS_{1,5} & SS_{1,6} & SS_{1,7} & SS_{1,8} & SS_{1,9} & SS_{1,10} \\ SS_{2,1} & SS_{2,2} & SS_{2,3} & SS_{2,4} & SS_{2,5} & SS_{2,6} & SS_{2,7} & SS_{2,8} & SS_{2,9} & SS_{2,10} \\ SS_{3,1} & SS_{3,2} & SS_{3,3} & SS_{3,4} & SS_{3,5} & SS_{3,6} & SS_{3,7} & SS_{3,8} & SS_{3,9} & SS_{3,10} \\ SS_{4,1} & SS_{4,2} & SS_{4,3} & SS_{4,4} & SS_{4,5} & SS_{4,6} & SS_{4,7} & SS_{4,8} & SS_{4,9} & SS_{4,10} \\ SS_{5,1} & SS_{5,2} & SS_{5,3} & SS_{5,4} & SS_{5,5} & SS_{5,6} & SS_{5,7} & SS_{5,8} & SS_{5,9} & SS_{5,10} \\ SS_{6,1} & SS_{6,2} & SS_{6,3} & SS_{6,4} & SS_{6,5} & SS_{6,6} & SS_{6,7} & SS_{6,8} & SS_{6,9} & SS_{6,10} \\ SS_{7,1} & SS_{7,2} & SS_{7,3} & SS_{7,4} & SS_{7,5} & SS_{7,6} & SS_{7,7} & SS_{7,8} & SS_{7,9} & SS_{7,10} \\ SS_{8,1} & SS_{8,2} & SS_{8,3} & SS_{8,4} & SS_{8,5} & SS_{8,6} & SS_{8,7} & SS_{8,8} & SS_{8,9} & SS_{8,10} \\ SS_{9,1} & SS_{9,2} & SS_{9,3} & SS_{9,4} & SS_{9,5} & SS_{9,6} & SS_{9,7} & SS_{9,8} & SS_{9,9} & SS_{9,10} \\ SS_{10,1} & SS_{10,2} & SS_{10,3} & SS_{10,4} & SS_{10,5} & SS_{10,6} & SS_{10,7} & SS_{10,8} & SS_{10,9} & SS_{10,10} \end{bmatrix} = \begin{bmatrix} 255 & 255 & 255 & 255 & 255 & 255 & 255 & 255 & 255 & 255 \\ 230 & 230 & 230 & 230 & 230 & 230 & 230 & 230 & 230 & 230 \\ 230 & 230 & 204 & 204 & 204 & 204 & 204 & 204 & 204 & 204 \\ 204 & 204 & 179 & 204 & 204 & 204 & 204 & 204 & 204 & 204 \\ 179 & 179 & 153 & 179 & 204 & 204 & 204 & 204 & 204 & 204 \\ 128 & 128 & 102 & 128 & 153 & 204 & 204 & 204 & 204 & 204 \\ 102 & 102 & 77 & 102 & 128 & 179 & 204 & 204 & 204 & 204 \\ 77 & 77 & 51 & 77 & 102 & 153 & 179 & 204 & 204 & 204 \\ 51 & 51 & 26 & 51 & 77 & 128 & 153 & 179 & 204 & 204 \\ 26 & 26 & 0 & 26 & 51 & 102 & 128 & 153 & 179 & 204 \end{bmatrix}$$

As is apparent from the image shown in FIG. 7 and the values obtained by converting the cumulative luminance values of the sub-pixels $SS_{i,j}$, the sub-pixel $SS_{10,3}$ (the sub-pixel on the 10th row from above and the third column from the left) is darkest, which indicates that the defect DF exists. In this embodiment, simple accumulation of sensor measurement values is used to create a sub-pixel image. Therefore, a ghost-like pattern caused by a pixel size is generated from the defect DF as the start point in the sub-pixel image but can be removed by filtering.

As described above, according to this embodiment, it is possible to detect (specify) a defect (the position thereof) existing in the inspection target 102 with the spatial resolution of the imaging unit 101 or lower by performing a sub-pixel image process for the inspection image obtained by capturing the inspection target 102. Furthermore, in this embodiment, instead of performing a sub-pixel image process for the whole inspection image, a sub-pixel image process is performed only for a pixel where a defect exists and pixels around the pixel where the defect exists by comparing the inspection image with the reference image. Therefore, it is possible to reduce the calculation load in inspection of the inspection target 102, thereby shortening the time required for inspection.

Second Embodiment

Figure 8:
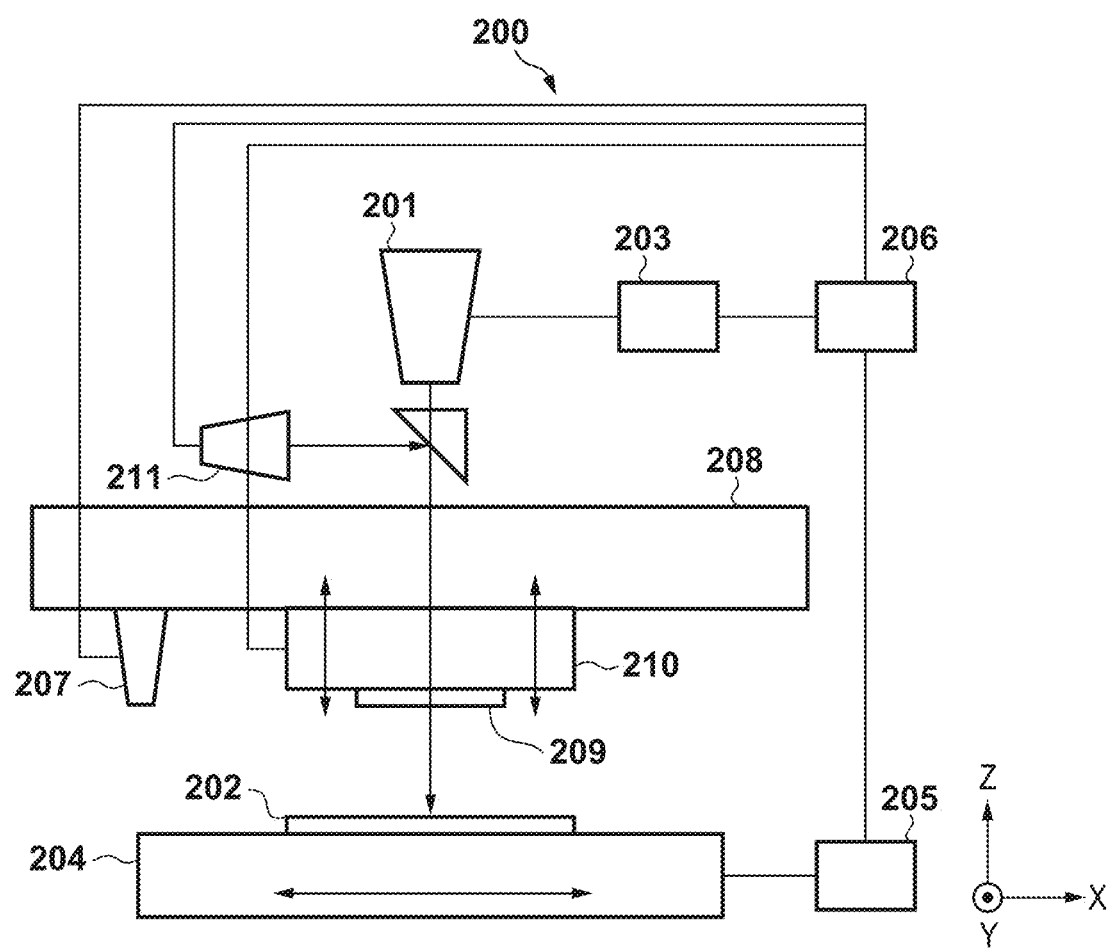
FIG. 8 is a schematic view illustrating configurations of an imprint apparatus according to a second embodiment.

FIG. 8 is a schematic view illustrating configurations of an imprint apparatus 200 according to a second embodiment. The imprint apparatus 200 is a lithography apparatus employed in a lithography step that is a manufacturing step for a device such as a semiconductor element, a liquid crystal display element, or magnetic storage medium as an article to form a pattern on a substrate. The imprint apparatus 200 performs an imprint process for forming a pattern of an imprint material on a substrate using a mold. More specifically, the imprint apparatus 200 brings an uncured imprint material supplied (arranged) on the substrate into contact with the mold, and applies curing energy to the imprint material, thereby forming a pattern of a cured product to which the pattern of the mold is transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa·s (inclusive) to 100 mPa·s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semiconductor compound wafer, silica glass, and the like.

In the specification and the accompanying drawings, directions will be indicated on an XYZ coordinate system in which directions parallel to a plane on which the substrate is placed are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are OX, OY, and OZ, respectively.

In this embodiment, the imprint apparatus 200 employs, as an imprint material curing method, a photocuring method of curing an imprint material by irradiating it with light. However, the present invention is not limited to this. For example, the imprint apparatus 200 can also employ, as the imprint material curing method, a heat-curing method of curing an imprint material by applying heat.

As shown in FIG. 8, the imprint apparatus 200 includes an imaging unit 201, an image storage unit 203, a substrate stage 204, a position storage unit 205, a control unit 206, a dispenser 207, a main body structure 208, an imprint head 210, and an irradiation unit 211.

The imaging unit 201 includes, for example, a CCD camera or a CMOS camera, and is provided above a mold 209. The imaging unit 201 captures a substrate 202 such as a semiconductor wafer as an inspection target on an imaging surface, thereby obtaining an inspection image. The imaging unit 201 is also called a spread camera. The image storage unit 203 includes, for example, a computer for image storage, and stores (saves) the inspection image obtained by the imaging unit 201. The substrate stage 204 is a stage that is driven while holding the substrate 202. In this embodiment, the substrate stage 204 is configured to be driven in a direction (X direction and Y direction) parallel to the imaging surface (sensor surface) of the imaging unit 201. Since the position of the substrate stage 204 can be controlled at accuracy of 1 nm or smaller under the control of the control unit 206, it is possible to correctly capture an arbitrary point (region) of the substrate 202 by the imaging unit 201 in sub-pixel shift imaging. The position storage unit 205 includes, for example, a computer for position storage, and stores (saves), as an inspection position, the position of the substrate stage 204 when the imaging unit 201 captures the substrate 202. The control unit 206 controls the respective units of the imprint apparatus 200 to operate the imprint apparatus 200. In this embodiment, the control unit 206 includes a computer for analysis, and has a function of analyzing the inspection image stored in the image storage unit 203 and the inspection position stored in the position storage unit 205 and controlling a process concerning inspection of the imprint process.

The dispenser 207 is provided in the main body structure 208, and has a function of arranging (supplying) an imprint material, more specifically, droplets of an imprint material on the substrate. In this embodiment, the dispenser 207 is provided at a position apart from the imprint head 210 that holds the mold 209, for example, a position apart from the imprint head 210 in the X direction, the Y direction, or the X and Y directions. An operation of arranging the imprint material on the substrate from the dispenser 207 is controlled by the control unit 206 in consideration of the position information of the substrate stage 204.

The mold 209 is an original called a template, or mask, and is held by the imprint head 210. The imprint head 210 is provided in the main body structure 208, and is configured to be driven in the vertical direction (Z direction). Driving in the vertical direction of the imprint head 210 is controlled by the control unit 206 in consideration of the position information of the substrate stage 204.

A pattern (for example, a circuit pattern) to be transferred to the imprint material on the substrate is formed on the surface of the mold 209, that is, the pattern surface of the mold 209 on the substrate side. By lowering the imprint head 210 that holds the mold 209, the pattern surface of the mold 209 is brought into contact (tight contact) with the imprint material on the substrate. The shape of the mold 209 is controlled so that the central portion of the pattern surface of the mold 209 has a convex shape to the substrate side immediately before the pattern surface of the mold 209 contacts the imprint material on the substrate. Thus, the central portion (convex portion) of the pattern surface of the mold 209 first contacts the imprint material, and a contact region between the imprint material and the pattern surface of the mold 209 spreads outwards on the pattern surface.

In a state in which the mold 209 is in contact with the imprint material on the substrate, the irradiation unit 211 irradiates the imprint material on the substrate with light (for example, ultraviolet rays) via the mold 209, thereby curing the imprint material on the substrate. After the irradiation unit 211 irradiates the imprint material on the substrate with light, the mold 209 is released from the cured imprint material on the substrate by raising the imprint head 210. This transfers the pattern of the mold 209 to the imprint material on the substrate. Irradiation of the imprint material on the substrate with light by the irradiation unit 211 is controlled by the control unit 206. A Digital Micro Device (DMD) may be incorporated in the irradiation unit 211. In this case, the irradiation unit 211 can irradiate the imprint material on the substrate with light via the DMD with a finer spatial resolution.

As the pattern formed on the pattern surface of the mold 209, patterns from a pattern with a line width of 50 nm or less to a pattern with a line width of several hundred times of 50 nm are mixed. In the imprint process, since the time (filling time) taken to fill the pattern (concave portion) of the mold 209 with the imprint material is one of factors that occupy most of the processing time, shortening of the filling time largely contributes to improvement of productivity. In recent years, it has been required to make the filling time fall within about 1 sec. However, if the pattern of the mold 209 is insufficiently filled with the imprint material by shortening the filling time, this causes a defect in the pattern of the imprint material formed on the substrate.

When forming the pattern of the imprint material on the substrate, the imprint material may extrude outside a shot region (imprint region) of the substrate 202 in the outer peripheral portion of the shot region (to be referred to as "extrusion" hereinafter). For example, in a case where the pattern of the imprint material having a height of about 50 nm (in the vertical direction (Z direction) with respect to the line width) is formed on the substrate, the imprint material having a height of several hundred nm may extrude. In this case, the extrusion of the imprint material causes a large difference in residual film thickness of the pattern of the imprint material formed on the substrate, thereby degrading the etching characteristic. Note that even if a small amount of the imprint material extrudes, for example, the imprint material that extrudes outside the shot region adheres and accumulates on the mold 209 (the side surface thereof), and may fall as a large lump (particle) on the substrate. This degrades the etching characteristic and also inhibits formation of the pattern on the substrate. Furthermore, if the mold 209 is brought into contact with the particle fallen on the substrate, the mold 209 may be damaged.

To cope with this, in this embodiment, at least one of inspection targets (A) and (B) below is inspected as inspection of the imprint process. (A) the presence/absence of a defect in the pattern of the imprint material formed on the substrate (the shot region thereof)

(B) the presence/absence of extrusion of the imprint material outside the shot region (the region where the pattern of the imprint material is to be formed) on the substrate In the process concerning inspection of the imprint process, similar to the first embodiment, a plurality of sub-pixel shift images are obtained by repeating averaging imaging by the imaging unit 201 and sub-pixel driving of the substrate stage 204, and a sub-pixel image process is performed.

For example, the imprint process includes an arrangement process including stage driving of driving the substrate stage 204 between a first position below the mold 209 and a second position below the dispenser 207 to arrange the imprint material in the shot region on the substrate. Therefore, in the imprint process, there is an opportunity in which a plurality of states are obtained, in each of which the shot region on the substrate is sub-pixel shifted with respect to the imaging surface of the imaging unit 201 in accordance with the stage driving during the arrangement process. When the plurality of states are obtained, a plurality of sub-pixel shift images (first sub-pixel shift images) corresponding to the respective states are obtained by capturing the shot region on the substrate by the imaging unit 201. Then, based on the plurality of sub-pixel shift images obtained by the imaging unit 201, the imprint process, more specifically, at least one of the above-described inspection targets (A) and (B) is inspected.

Note that the sub-pixel image process for the plurality of sub-pixel shift images is similar to in the first embodiment. Therefore, sub-pixel shift imaging including averaging imaging by the imaging unit 201 and sub-pixel driving of the substrate stage 204 will be described below.

In this embodiment, as a method of arranging a droplet of the imprint material in the shot region on the substrate, a so-called J-FIL method is employed. In the J-FIL method, the substrate stage 204 that holds the substrate 202 is reciprocally driven so that the shot region on the substrate (the position (target position) at which a droplet of the imprint material is to be arranged) passes through the second position below the dispenser 207. At this time, a droplet of the imprint material is arranged in the shot region on the substrate by discharging the droplet of the imprint material from the dispenser 207 so that the droplet of the imprint material lands at the target position on the substrate.

The stage driving during the arrangement process is completed when the shot region on the substrate where the imprint material has been arranged returns to a position immediately below the mold 209, that is, a position immediately below the imaging unit 201. In other words, the stage driving during the arrangement process includes first driving of driving, from the second position below the dispenser 207 to the first position below the mold 209, the substrate stage 204 that holds the substrate 202 on which the droplet of the imprint material is arranged in the shot region.

When the shot region on the substrate where the imprint material has been arranged returns to the position immediately below the mold 209 or the imaging unit 201, the droplet of the imprint material has a diameter of about 100 µm which depends on an imprint condition. Therefore, in a case where the imaging unit 201 (imaging surface) has a spatial resolution of about 30 µm, it is possible to sufficiently recognize the presence/absence of the droplet of the imprint material arranged in the shot region on the substrate.

Thus, during the first driving in the stage driving in the arrangement process, more specifically, immediately before completion of the first driving, sub-pixel shift imaging is performed using a status where the plurality of states are obtained, in each of which the shot region on the substrate is sub-pixel shifted with respect to the imaging surface of the imaging unit 201. The target of sub-pixel shift imaging is the shot region where the droplet of the imprint material has been arranged among the plurality of shot regions on the substrate. More specifically, while the substrate stage 204 is decelerated to stop at the first position below the mold 209 during the first driving, sub-pixel shift imaging is performed using a status where the speed of the substrate stage 204 gradually approaches zero. In this embodiment, while the substrate stage 204 is decelerated, before the substrate stage 204 stops, sub-pixel shift imaging is performed while driving the substrate stage 204 to obliquely cross one pixel forming the imaging surface of the imaging unit 201. At this time, the speed of the substrate stage 204 and the frame rate of the imaging unit 201 are set in accordance with the spatial resolution obtained in the sub-pixel shift image process and the size and luminance of the inspection target. Note that driving of the substrate stage 204 to obliquely cross one pixel forming the imaging surface of the imaging unit 201 means driving of the substrate stage 204 in a third direction intersecting a first direction and a second direction that define the size of the one pixel and are orthogonal to each other.

Figure 9A:
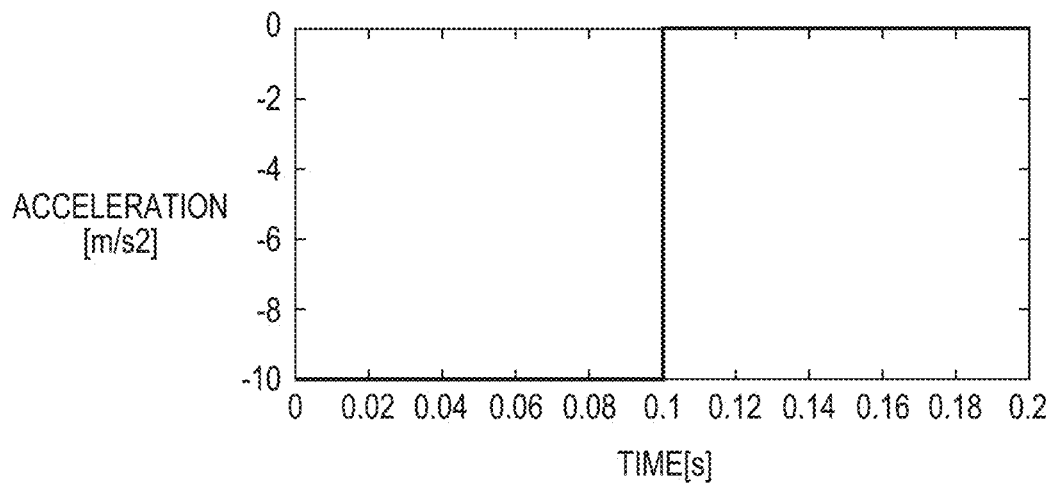
FIGS. 9A to 9C are timing charts showing the relationships between the time after the start of deceleration of a substrate stage and the acceleration, speed, and position of the substrate stage, respectively.
Figure 9B:
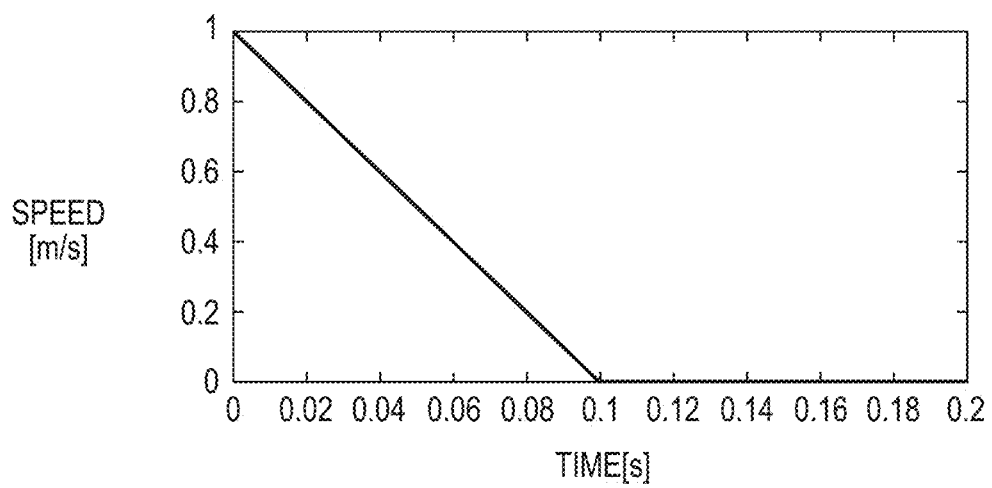
Figure 9C:
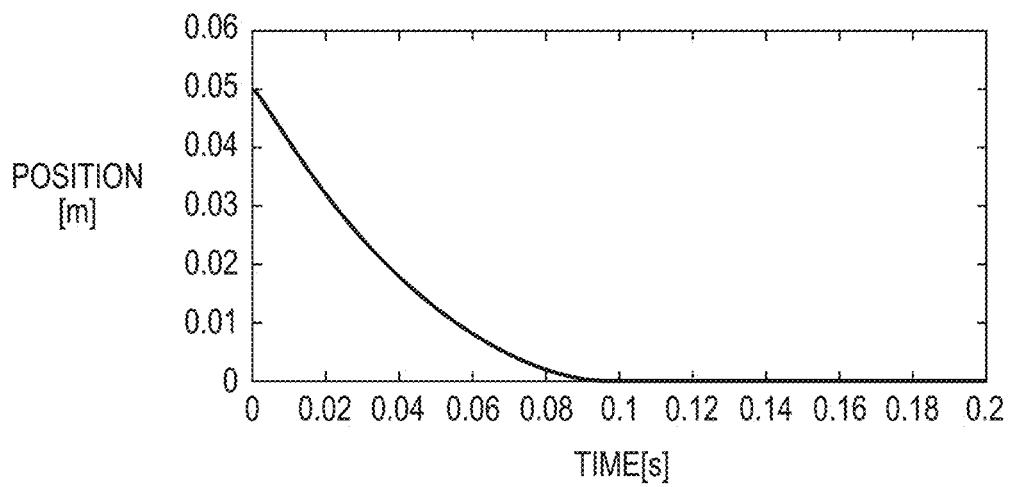

Assume, for example, that the substrate stage 204 is decelerated at a speed of 1 m/s and an acceleration of −10 m/s² (corresponding to about 1 G) with respect to the first position below the mold 209. FIGS. 9A, 9B, and 9C are timing charts showing the relationships between the time (elapsed time) [s] after the start of deceleration of the substrate stage 204 and the acceleration [m/s²], speed [m/s], and position [m] of the substrate stage 204, respectively. Note that as shown in FIG. 9A, the acceleration of the substrate stage 204 does not actually become the minimum value instantaneously, but becomes the minimum value instantaneously in this example for the sake of simplicity.

If an acceleration of −10 m/s² is applied during a period of 0.0999 s after the start of deceleration of the substrate stage 204, the speed of the substrate stage 204 is decreased from 1 m/s to 0.001 m/s (1,000 µm/s). At this time, as shown in FIGS. 9B and 9C, it looks as if the substrate stage 204 almost stopped, but the substrate stage 204 is actually driven on the order of µm.

To gradually decelerate the substrate stage 204, the acceleration applied to the substrate stage 204 is switched from −10 m/s² to −0.01 m/s² (10,000 µm/s²). After switching the acceleration applied to the substrate stage 204, the acceleration of the substrate stage 204 is very small. Therefore, as shown in FIG. 9A, it looks as if the acceleration of the substrate stage 204 were zero but the acceleration is not actually zero and is −0.01 m/s², as described above. This makes the substrate stage 204 stop at a low speed.

Figure 10A:
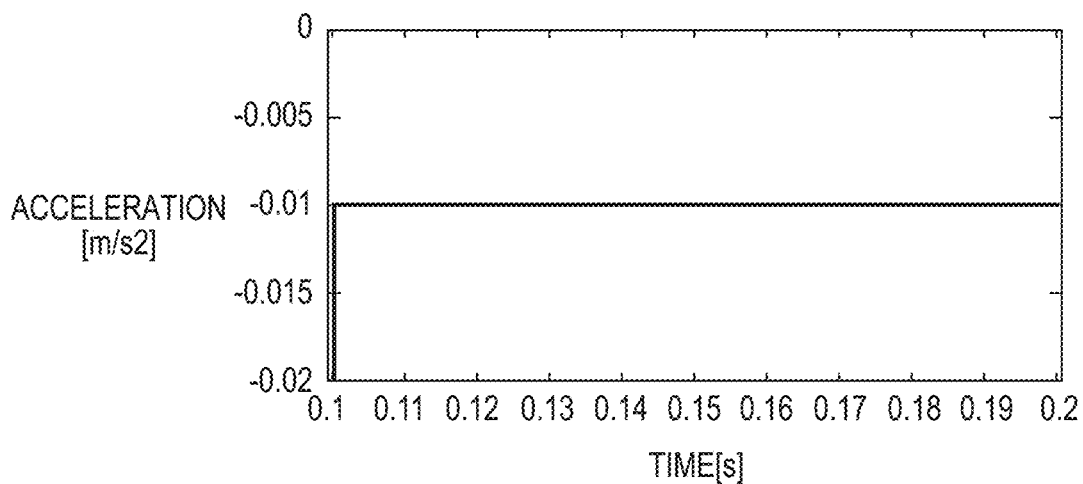
FIGS. 10A to 10C are timing charts showing the relationships between the time after switching of acceleration of the substrate stage and the acceleration, speed, and position of the substrate stage, respectively.
Figure 10B:
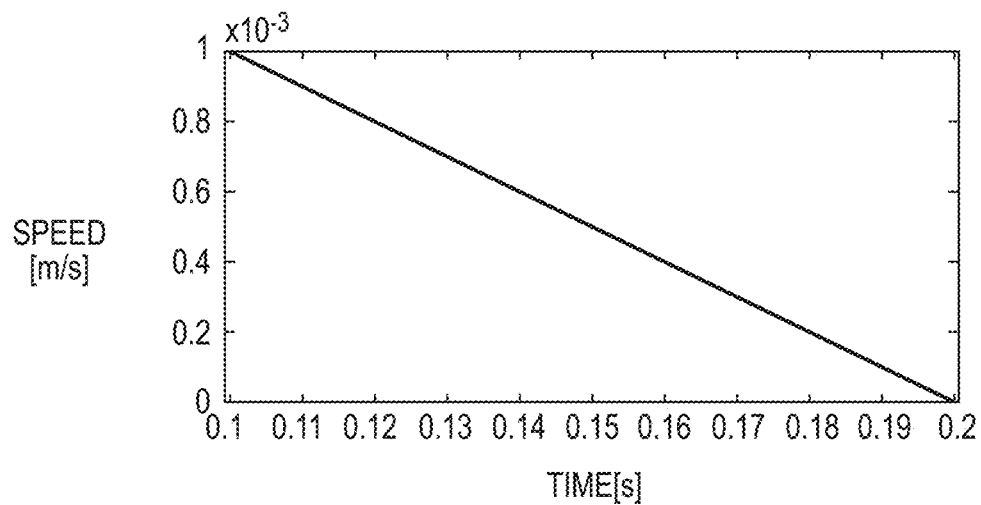
Figure 10C:
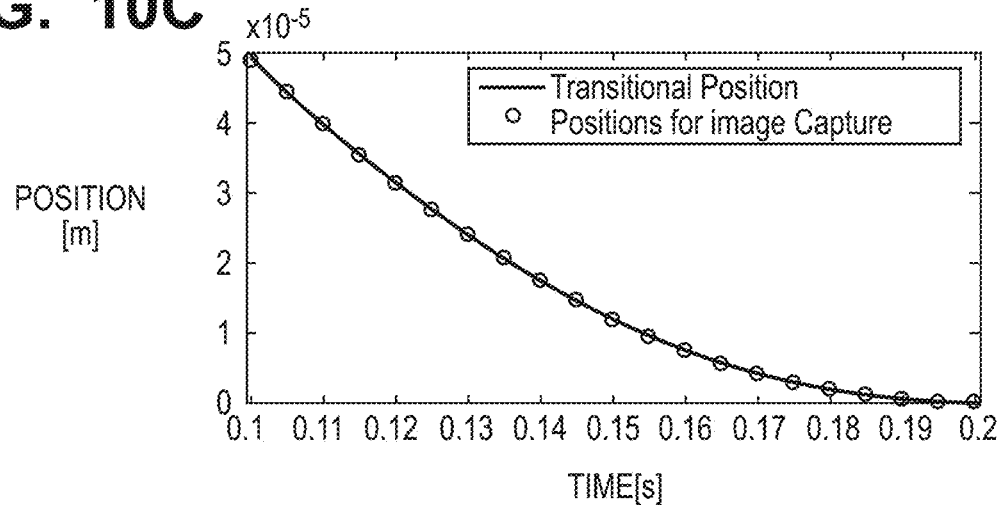

FIGS. 10A, 10B, and 10C are timing charts showing the relationships between the time (elapsed time) after switching of the acceleration of the substrate stage 204 to −0.01 m/s² and the acceleration [m/s²], speed [m/s], and position [m] of the substrate stage 204, respectively. FIG. 10C shows a timing (imaging time) of performing sub-pixel shift imaging as a marker expressed by an open circle. Sub-pixel shift imaging is performed at an interval of 5 ms, and this timing coincides with an image obtaining timing in a case where the frame rate of the imaging unit 201 is set to 200 fps. In this embodiment, the timing (imaging time) of performing sub-pixel shift imaging, the speed of the substrate stage 204, and the position of the substrate stage 204 are shown in Table 1 below.

TABLE 1

| Imaging Time [s] | Speed of Substrate Stage [m/s] | Position of Substrate Stage [μm] |
|---|---|---|
| 0.0999 | 0.001 | 50.05 |
| 0.1049 | 0.0009 | 45.1725 |
| 0.1099 | 0.0009 | 40.545 |
| 0.1149 | 0.0008 | 36.1675 |
| 0.1199 | 0.0008 | 32.04 |
| 0.1249 | 0.0007 | 28.1625 |
| 0.1299 | 0.0007 | 24.535 |
| 0.1349 | 0.0006 | 21.1575 |
| 0.1399 | 0.0006 | 18.03 |
| 0.1449 | 0.0005 | 15.1525 |
| 0.1499 | 0.0005 | 12.525 |
| 0.1549 | 0.0004 | 10.1475 |
| 0.1599 | 0.0004 | 8.02 |
| 0.1649 | 0.0003 | 6.1425 |
| 0.1699 | 0.0003 | 4.515 |
| 0.1749 | 0.0002 | 3.1375 |
| 0.1799 | 0.0002 | 2.01 |
| 0.1849 | 0.0001 | 1.1325 |
| 0.1899 | 0.0001 | 0.505 |
| 0.1949 | 0 | 0.1275 |
| 0.1999 | 0 | 0 |

Referring to FIGS. 10B and 10C and Table 1, during very slow deceleration immediately before the substrate stage 204 completely stops, more specifically, while the speed of the substrate stage 204 is 0.001 m/s or lower, sub-pixel shift imaging is performed. This can obtain a sub-pixel shift image of 5 μm or less. Note that one axis (for example, the X-axis) has been explained but the same applies to another axis (for example, the Y-axis). This makes it possible to perform sub-pixel shift imaging while driving the substrate stage 204 to obliquely cross one pixel forming the imaging surface of the imaging unit 201.

The sub-pixel shift image obtained by sub-pixel shift imaging performed during the first driving in the stage driving in the arrangement process includes an image of a droplet (array) of the imprint material arranged in the shot region on the substrate. Based on the shift between the target position of the droplet of the imprint material and the actual position of the droplet of the imprint material obtained from the sub-pixel shift image, the presence/absence of extrusion of the imprint material outside the shot region where the pattern is to be formed is inspected.

The imprint process includes a contact process, a curing process, and a releasing process in addition to the arrangement process. The contact process is a process of bringing the mold 209 and the imprint material on the substrate into contact with each other. The curing process is a step of curing the imprint material in a state in which the mold 209 and the imprint material on the substrate are in contact with each other. The releasing process is a step of releasing the mold 209 from the cured imprint material on the substrate.

If the series of processes (imprint process) is performed for one shot region among the plurality of shot regions on the substrate, the imprint process is performed (repeated) for the shot region adjacent to the one shot region. In other words, the arrangement process of arranging a droplet of the imprint material in the new shot region on the substrate is started. Therefore, the stage driving during the arrangement process includes second driving of driving, from the first position below the mold 209 to the second position below the dispenser 207, the substrate stage 204 that holds the substrate 202 on which the pattern has been formed in at least one shot region.

During the second driving in the stage driving in the arrangement process, sub-pixel shift imaging is performed using a status where a plurality of states are obtained, in each of which the shot region on the substrate where the pattern has been formed is sub-pixel shifted with respect to the imaging surface of the imaging unit 201. The target of sub-pixel shift imaging is the shot region, where the pattern of the imprint material has been formed, among the plurality of shot regions on the substrate. More specifically, while the substrate stage 204 is accelerated to drive the substrate stage 204 that stops at the first position below the mold 209 immediately after the second driving is started (in the initial stage of the second driving), sub-pixel shift imaging is performed. In this embodiment, sub-pixel shift imaging is performed while the speed of the substrate stage 204 gradually (gently) increases from zero, that is, while the speed of the substrate stage 204 is 0.001 m/s or lower. At this time, similar to the first driving, sub-pixel shift imaging is performed while driving the substrate stage 204 to obliquely cross one pixel forming the imaging surface of the imaging unit 201. Note that the speed of the substrate stage 204 and the frame rate of the imaging unit 201 are set in accordance with the spatial resolution obtained in the sub-pixel shift image process and the size and luminance of the inspection target.

The sub-pixel shift image obtained by sub-pixel shift imaging performed during the second driving in the stage driving in the arrangement process includes an image of the pattern of the imprint material formed in the shot region on the substrate. Based on the sub-pixel shift image including the image of the pattern of the imprint material, at least one of the presence/absence of a defect in the pattern and the presence/absence of extrusion of the imprint material outside the shot region where the pattern has been formed is inspected.

As described above, according to this embodiment, by applying sub-pixel shift imaging (sub-pixel image process) described in the first embodiment, inspection of the imprint process can be performed with a resolution higher than the spatial resolution of the imaging unit 201, as a result. Note that inspection of the imprint process includes the presence/absence of a defect in the pattern of the imprint material formed on the substrate and the presence/absence of extrusion of the imprint material, as described above. Therefore, it is possible to detect (specify) the position of a defect in the pattern of the imprint material formed on the substrate and the position of extrusion of the imprint material with the spatial resolution of the imaging unit 201 or lower.

In this embodiment, sub-pixel shift imaging is performed when the plurality of states are obtained, in each of which the shot region on the substrate is sub-pixel shifted with respect to the imaging surface of the imaging unit 201 in accordance with the imprint process, more specifically, the stage driving during the arrangement process. Therefore, it is unnecessary to perform stage driving for inspection of the imprint process, thereby making it possible to shorten the time required for inspection of the imprint process. In other words, inspection of the imprint process can be performed as part of the imprint process. Note that instead of performing a sub-pixel image process for the whole image obtained by the imaging unit 201, a sub-pixel image process may be performed only for a pixel where a defect or extrusion exists and its peripheral pixels by performing comparison with the reference image. This can reduce the calculation load in inspection of the imprint process, and further shorten the time required for inspection of the imprint process.

Furthermore, the result of inspection of the imprint process is reflected on adjustment of an imprint condition in the imprint process. For example, based on the result of inspection of the imprint process, the control unit 206 adjusts, as an imprint condition, at least one of conditions concerning the position and amount of a droplet of the imprint material to be arranged on the substrate by the dispenser 207. More specifically, in a case where a defect exists in the pattern of the imprint material formed on the substrate, the position of a droplet of the imprint material to be arranged on the substrate is adjusted to be arranged near the defect. Alternatively, if extrusion of the imprint material exists, adjustment is performed so a droplet of the imprint material is not arranged near the position of the extrusion or so that the amount of a droplet of the imprint material arranged near the position of the extrusion is small. Note that based on the result of inspection of the imprint process, the control unit 206 may adjust, as an imprint condition, at least one of conditions concerning the position and intensity of light with which the imprint material on the substrate is irradiated by the irradiation unit 211. At this time, at least one of the conditions concerning the position and intensity of light with which the imprint material on the substrate is irradiated by the irradiation unit 211 is adjusted so a defect does not occur in the pattern of the imprint material formed on the substrate or so the imprint material does not extrude. Note that to adjust the position or intensity of light with which the imprint material on the substrate is irradiated by the irradiation unit 211, the DMD included in the irradiation unit 211 is used. By repeatedly adjusting the imprint condition in accordance with the result of inspection of the imprint process, it is possible to effectively suppress a defect occurring in the pattern of the imprint material formed on the substrate or extrusion of the imprint material.

The image obtained by the imaging unit 201 may include the pattern (the image thereof) of the mold 209. In this case, the imaging unit 201 captures a shot region on the substrate in a state in which the mold 209 is removed from the imprint head 210. This can perform a sub-pixel image process more accurately. Furthermore, with respect to a region adjacent to the shot region on the substrate, which is the target of inspection of the imprint process, even if the region is included in the image obtained by the imaging unit 201, the efficiency of the sub-pixel image process can be improved by excluding the region from a region for which the sub-pixel image process is performed.

Third Embodiment

Figure 11:
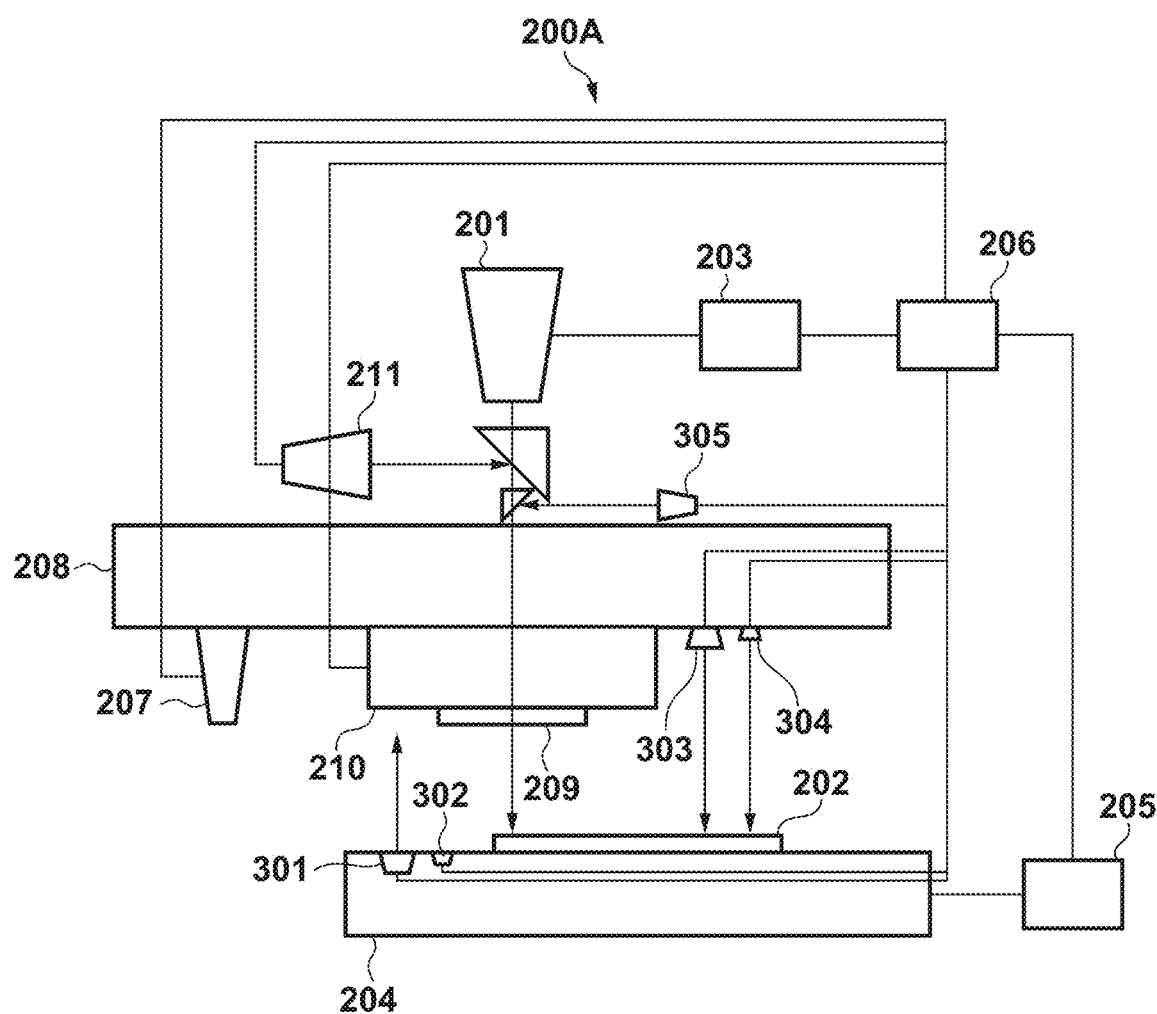
FIG. 11 is a schematic view illustrating configurations of an imprint apparatus according to a third embodiment.

FIG. 11 is a schematic view illustrating configurations of an imprint apparatus 200A according to one aspect of the present invention. The imprint apparatus 200A has an arrangement similar to that of the imprint apparatus 200 but further includes a first laser displacement gauge 301, a second laser displacement gauge 303, an illuminance meter 302, a first camera unit 304, and a second camera unit 305.

The first laser displacement gauge 301 is provided in a substrate stage 204, and has a function of measuring a displacement to the surface (pattern surface) of a mold 209 held by an imprint head 210. When the first laser displacement gauge 301 measures the displacement to the surface of the mold 209 while driving the substrate stage 204, the surface shape of the mold 209 can be obtained.

The second laser displacement gauge 303 is provided in a main body structure 208, and has a function of measuring a displacement to the surface of a substrate 202 held by the substrate stage 204. When the second laser displacement gauge 303 measures the displacement to the surface of the substrate 202 while driving the substrate stage 204, the surface shape of the substrate 202 can be obtained.

The illuminance meter 302 is provided in the substrate stage 204, and has a function of measuring the illuminance of light emitted from the irradiation unit 211. When the illuminance meter 302 measures the illuminance while driving the substrate stage 204, the illuminance distribution of the light on the substrate can be obtained.

The spot diameter of measurement light of the first laser displacement gauge 301 or the second laser displacement gauge 303 is normally several tens of µm to several hundred µm. Furthermore, the longitudinal and lateral dimensions of the light receiving surface of the illuminance meter 302 are normally several hundred µm to several mm. If measurement by the first laser displacement gauge 301, the second laser displacement gauge 303, and the illuminance meter 302 is considered to be performed for an image of one pixel, the sub-pixel image process described in the first embodiment can be applied. Therefore, the first laser displacement gauge 301 or the second laser displacement gauge 303 can obtain the surface shape of the mold 209 or the substrate 202 with a spatial resolution equal to or smaller than the spot diameter of the measurement light, and the illuminance meter 302 can obtain the illuminance distribution of the light on the substrate with a spatial resolution equal to smaller than a light receiving area.

The first camera unit 304 is provided in the main body structure 208, and includes a CCD camera or a CMOS camera. In this embodiment, the first camera unit 304 functions as a mark imaging unit that obtains an image by capturing, on a mark imaging surface, at a high magnification, an alignment mark provided on the substrate 202. The image obtained by the first camera unit 304 is used to align the substrate 202.

The second camera unit 305 has a similar arrangement as that of the first camera unit 304, and takes the same optical path as that of the light emitted from the irradiation unit 211. The second camera unit 305 functions as a mark imaging unit that obtains an image by capturing, on a mark imaging surface, an alignment mark provided in each of the mold 209 and the substrate 202 during an imprint process. The image obtained by the second camera unit 305 is used to align the mold 209 and the substrate 202.

In this embodiment, the first camera unit 304 and the second camera unit 305 are also used to inspect a defect existing in a pattern of an imprint material formed on the substrate. At this time, by applying a sub-pixel image process, it is possible to inspect, with a high spatial resolution, the defect existing in the pattern of the imprint material formed on the substrate. More specifically, the substrate stage 204 that holds the substrate 202 on which the pattern of the imprint material has been formed is driven with respect to the first camera unit 304 or the second camera unit 305. Then, when a plurality of states are obtained, in each of which the pattern (shot region) of the imprint material is sub-pixel shifted with respect to the mark imaging surface of the first camera unit 304 or the second camera unit 305, sub-pixel shift imaging is performed using the first camera unit 304 or the second camera unit 305. Thus, a plurality of sub-pixel shift images (second sub-pixel shift images) corresponding to the respective states in each of which the pattern of the imprint material is sub-pixel shifted with respect to the mark imaging surface of the first camera unit 304 or the second camera unit 305 are obtained. Based on the sub-pixel shift images, at least one of the presence/absence of a defect in the pattern of the imprint material formed on the substrate 202 and the presence/absence of extrusion of the imprint material outside the shot region where the pattern of the imprint material is to be formed is inspected.

As described above, by applying sub-pixel shift imaging (sub-pixel image process) described in the first embodiment, inspection of the imprint process can be performed with a resolution higher than the spatial resolution of the first camera unit 304 or the second camera unit 305, as a result.

Furthermore, an imaging unit 201 may be used to widely inspect a defect existing in the pattern of the imprint material formed on the substrate. Then, with respect to a point where the defect of the pattern of the imprint material has been confirmed (detected), for example, the first camera unit 304 with a high magnification is used to perform fine inspection by applying the sub-pixel image process. Therefore, it is possible to inspect the defect existing in the pattern of the imprint material formed on the substrate with a resolution higher than the spatial resolution of the first camera unit 304.

Note that it is possible to apply the sub-pixel image process to alignment of the substrate 202 using the first camera unit 304 or alignment between the mold 209 and the substrate 202 using the second camera unit 305.

Fourth Embodiment

The pattern of a cured product formed using the imprint apparatus 200 or 200A is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 12A:
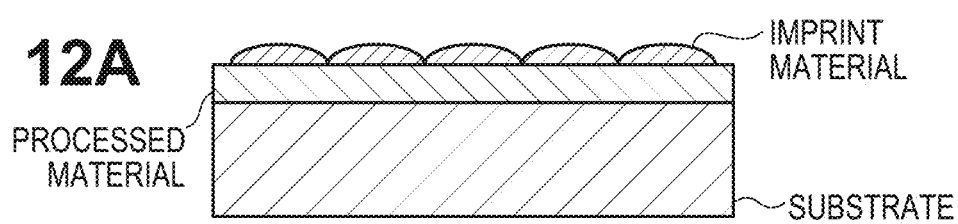
FIGS. 12A to 12F are views for describing an article manufacturing method.

Next, description regarding a detailed method of manufacturing an article is given. As illustrated in FIG. 12A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

Figure 12B:
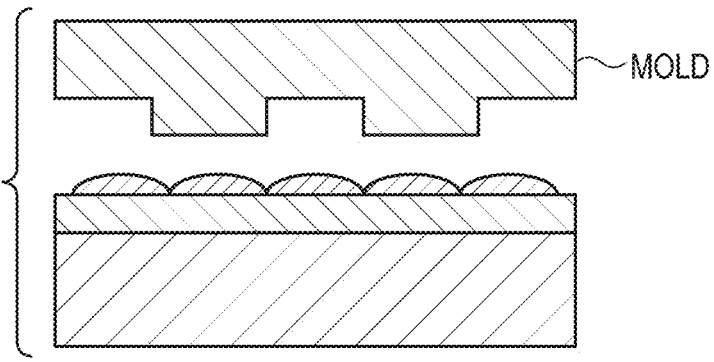
Figure 12C:
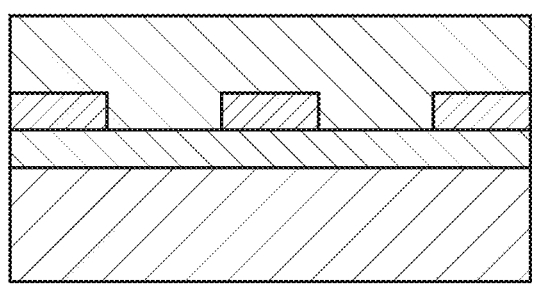

As shown in FIG. 12B, a side of the mold for imprint with a projection and groove pattern is formed on and caused to face the imprint material on the substrate. As illustrated in FIG. 12C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

Figure 12D:
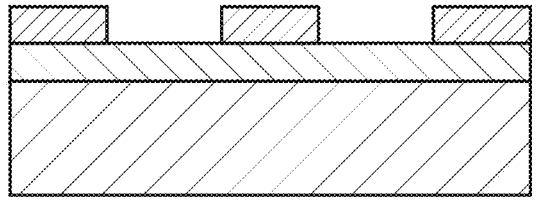

As shown in FIG. 12D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

Figure 12E:
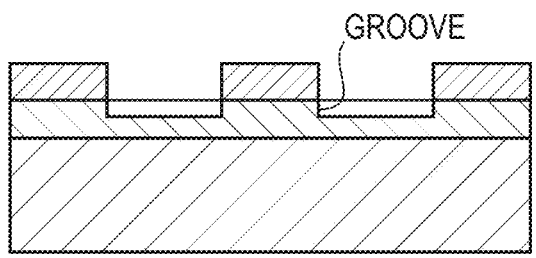
Figure 12F:
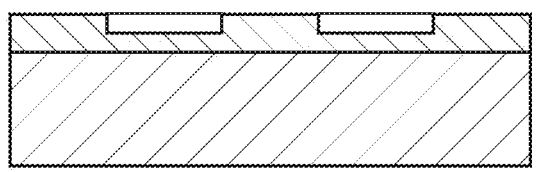

As shown in FIG. 12E, when etching is performed using the pattern of the cured product as an etching resistant mask, a portion of the surface of the processed material where the cured product does not exist or remains thin is removed to form a groove. As shown in FIG. 12F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2022-119833 filed on Jul. 27, 2022, which is hereby incorporated by reference herein in its entirety.

What is claimed is:

1. An imprint apparatus for performing an imprint process of forming a pattern of an imprint material on a substrate using a mold, comprising:
   a stage configured to be driven while holding the substrate;
   a dispenser configured to arrange the imprint material on the substrate;
   an imaging unit provided above the mold and configured to obtain an image by capturing, on an imaging surface, the substrate held by the stage; and
   a control unit configured to control a process concerning inspection of the imprint process,
   wherein the imprint process includes an arrangement process including stage driving of driving the stage between a first position below the mold and a second position below the dispenser to arrange the imprint material in a shot region on the substrate, and
   wherein, during the arrangement process, the stage driving causes the shot region to be shifted relative to the imaging surface by sub-pixel amounts in a plurality of different positions, and the control unit obtains a plurality of first sub-pixel shift images corresponding to the plurality of different positions by causing the imaging unit to capture the shot region, and inspects the imprint process based on the plurality of first sub-pixel shift images.

2. The apparatus according to claim 1, wherein
   the dispenser arranges a droplet of the imprint material in the shot region on the substrate,
   the stage driving includes first driving of driving, from the second position to the first position, the stage that holds the substrate on which the droplet of the imprint material has been arranged in the shot region, and
   the plurality of different positions include two or more positions in each of which the shot region is sub-pixel shifted with respect to the imaging surface during the first driving.

3. The apparatus according to claim 2, wherein the plurality of different positions include two or more positions in each of which the shot region is sub-pixel shifted with respect to the imaging surface while the stage is decelerated to stop the stage at the first position during the first driving.

4. The apparatus according to claim 3, wherein the plurality of different positions include two or more positions in each of which the shot region is sub-pixel shifted with respect to the imaging surface while a speed of the stage is not higher than 0.001 m/s during the first driving.

5. The apparatus according to claim 3, wherein while the stage is decelerated, the stage is driven in a direction intersecting a first direction and a second direction that define a size of one pixel forming the imaging surface and are orthogonal to each other.

6. The apparatus according to claim 2, wherein based on a shift between a position of the droplet of the imprint material arranged on the substrate obtained from each of the plurality of first sub-pixel shift images and a target position of the droplet of the imprint material to be arranged on the substrate, the control unit inspects the presence/absence of extrusion of the imprint material outside the region where the pattern is to be formed on the substrate.

7. The apparatus according to claim 1, wherein
the substrate includes a plurality of shot regions,
the stage driving includes second driving of driving, from the first position to the second position, the stage that holds the substrate on which the pattern has been formed in at least one shot region among the plurality of shot regions, and
the plurality of different positions include two or more positions in each of which the at least one shot region is sub-pixel shifted with respect to the imaging surface during the second driving.

8. The apparatus according to claim 7, wherein the plurality of different positions include two or more positions in each of which the at least one shot region is sub-pixel shifted with respect to the imaging surface while the stage is accelerated to drive the stage that stops at the first position during the second driving.

9. The apparatus according to claim 8, wherein the plurality of different positions include two or more positions in each of which the at least one shot region is sub-pixel shifted with respect to the imaging surface while a speed of the stage is not higher than 0.001 m/s during the second driving.

10. The apparatus according to claim 8, wherein while the stage is decelerated, the stage is driven in a direction intersecting a first direction and a second direction that define a size of one pixel forming the imaging surface and are orthogonal to each other.

11. The apparatus according to claim 7, wherein based on the plurality of first sub-pixel shift images, the control unit inspects at least one of the presence/absence of a defect in the pattern formed in the at least one shot region and the presence/absence of extrusion of the imprint material outside the at least one shot region.

12. The apparatus according to claim 1, wherein
the stage driving includes third driving of driving the stage in a direction intersecting a first direction and a second direction that define a size of one pixel forming the imaging surface and are orthogonal to each other, and
the plurality of different positions include two or more positions in each of which the shot region is sub-pixel shifted with respect to the imaging surface during the third driving.

13. The apparatus according to claim 1, wherein
the control unit adjusts an imprint condition in the imprint process based on a result of the inspection of the imprint process, and
the imprint condition includes at least one of conditions concerning a position and an amount of a droplet of the imprint material to be arranged on the substrate by the dispenser.

14. The apparatus according to claim 1, further comprising:
an irradiation unit configured to irradiate the imprint material on the substrate with light,
wherein the control unit adjusts an imprint condition in the imprint process based on a result of the inspection of the imprint process, and
the imprint condition includes at least one of conditions concerning a position and intensity of the light with which the imprint material on the substrate is irradiated by the irradiation unit.

15. The apparatus according to claim 1, further comprising:
a mark imaging unit configured to obtain an image by capturing, on a mark imaging surface, a mark provided on the substrate,
wherein the plurality of different positions include two or more positions in each of which the pattern is sub-pixel shifted with respect to the mark imaging surface while driving the stage that holds the substrate on which the pattern has been formed, a plurality of second sub-pixel shift images corresponding to the plurality of different positions are obtained by causing the mark imaging unit to capture the pattern formed on the substrate, and at least one of the presence/absence of a defect in the pattern formed on the substrate and the presence/absence of extrusion of the imprint material outside the shot region where the pattern is to be formed is inspected based on the plurality of second sub-pixel shift images.

16. The apparatus according to claim 15, wherein the mark imaging unit obtains an image by capturing, on the mark imaging surface, a mark provided on the substrate and a mark provided on the mold.

* * * * *